US011568934B2

(12) United States Patent
Mikhalev et al.

(10) Patent No.: US 11,568,934 B2
(45) Date of Patent: Jan. 31, 2023

(54) MULTI-GATE TRANSISTORS, APPARATUS HAVING MULTI-GATE TRANSISTORS, AND METHODS OF FORMING MULTI-GATE TRANSISTORS

(71) Applicant: MICRON TECHNOLOGY, INC., Boise, ID (US)

(72) Inventors: Vladimir Mikhalev, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 107 days.

(21) Appl. No.: 17/223,482

(22) Filed: Apr. 6, 2021

(65) Prior Publication Data
US 2022/0319599 A1 Oct. 6, 2022

(51) Int. Cl.
*H01L 27/11556* (2017.01)
*H01L 29/66* (2006.01)
(Continued)

(52) U.S. Cl.
CPC ...... *G11C 16/0483* (2013.01); *H01L 27/1157* (2013.01); *H01L 27/11519* (2013.01);
(Continued)

(58) Field of Classification Search
CPC ......... H01L 27/11519; H01L 27/11524; H01L 27/11529; H01L 27/11556; H01L 27/11565; H01L 27/1157; H01L 27/11573; H01L 27/11582; H01L 29/40114; H01L 29/40117; H01L 29/42328; H01L 29/42344; H01L 29/66484;
(Continued)

(56) References Cited

U.S. PATENT DOCUMENTS 9,076,722 B2 * 7/2015 Sakuma .............. H01L 29/7881
10,453,533 B2 10/2019 Lee

OTHER PUBLICATIONS

École Polytechnique Fédérate de Lausanne (EPFL), "MIGFET Synthesis Package", Computer Architecture and Integrated Systems, https://www.epfl.ch/labs/lsi/page-102566-en-html/migfet-2, Sep. 2018, pp. 1.

* cited by examiner

Primary Examiner — David Vu
(74) Attorney, Agent, or Firm — Dicke, Billig & Czaja, PLLC

(57) ABSTRACT

Multi-gate transistors, as well as apparatus containing such multi-gate transistors and methods of forming such multi-gate transistors, might facilitate gating voltages in integrated circuit devices. Such multi-gate transistors might include an active area having a first conductivity type, a first source/drain region in the active area and having a second conductivity type different than the first conductivity type, a second source/drain region in the active area and having the second conductivity type, and a plurality of control gates adjacent the active area between the first source/drain region and the second source/drain region, wherein each control gate of the plurality of control gates comprises a respective plurality of control gate portions, and wherein, for a particular control gate of the plurality of control gates, each control gate portion of its respective plurality of control gate portions is adjacent the active area in a respective plane of a plurality of different planes.

32 Claims, 29 Drawing Sheets

(51) Int. Cl.
*G11C 16/04* (2006.01)
*H01L 29/423* (2006.01)
*H01L 27/11524* (2017.01)
*H01L 27/11529* (2017.01)
*H01L 27/11565* (2017.01)
*H01L 27/1157* (2017.01)
*H01L 27/11573* (2017.01)
*H01L 27/11582* (2017.01)
*H01L 29/792* (2006.01)
*H01L 29/788* (2006.01)
*H01L 21/28* (2006.01)
*H01L 27/11519* (2017.01)

(52) U.S. Cl.
CPC .. *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01); *H01L 29/40114* (2019.08); *H01L 29/40117* (2019.08); *H01L 29/42328* (2013.01); *H01L 29/42344* (2013.01); *H01L 29/66484* (2013.01); *H01L 29/66825* (2013.01); *H01L 29/66833* (2013.01); *H01L 29/7889* (2013.01); *H01L 29/7926* (2013.01)

(58) Field of Classification Search
CPC ......... H01L 29/66825; H01L 29/66833; H01L 29/7889; H01L 29/7926
See application file for complete search history.

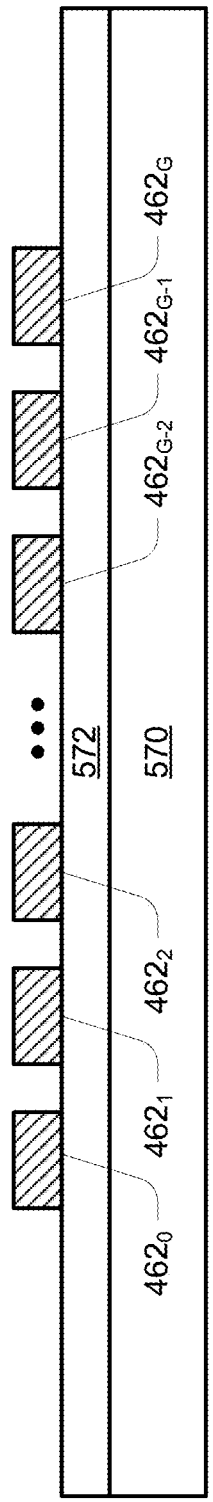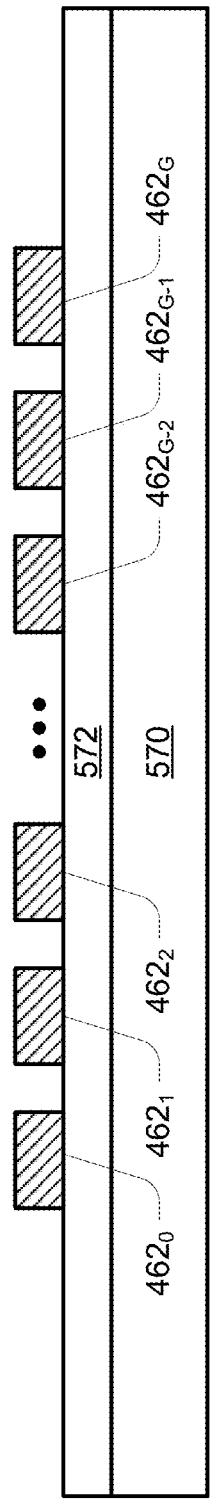

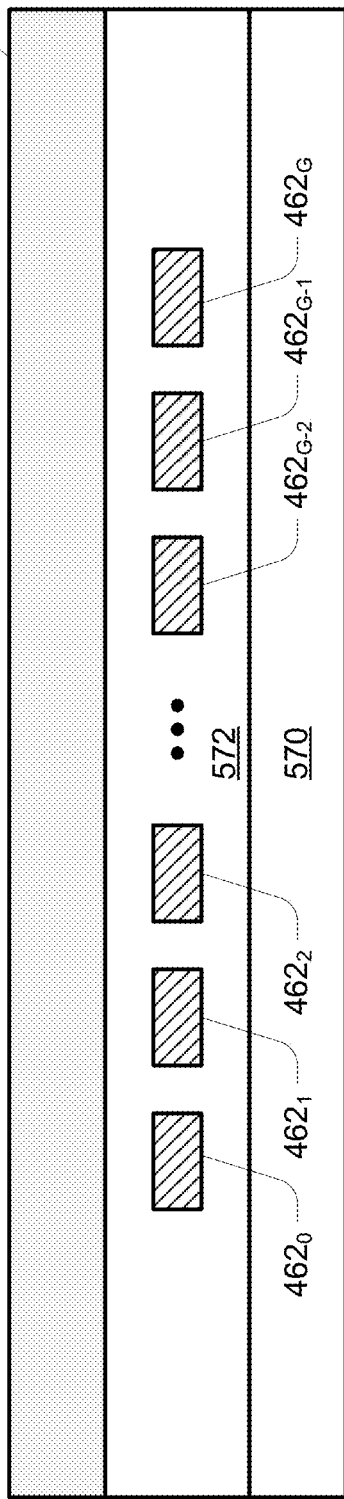
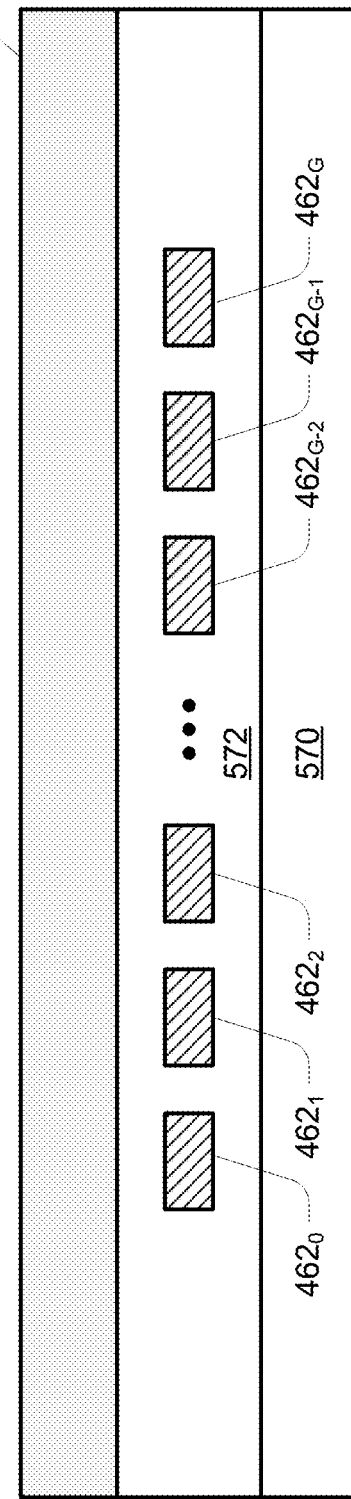

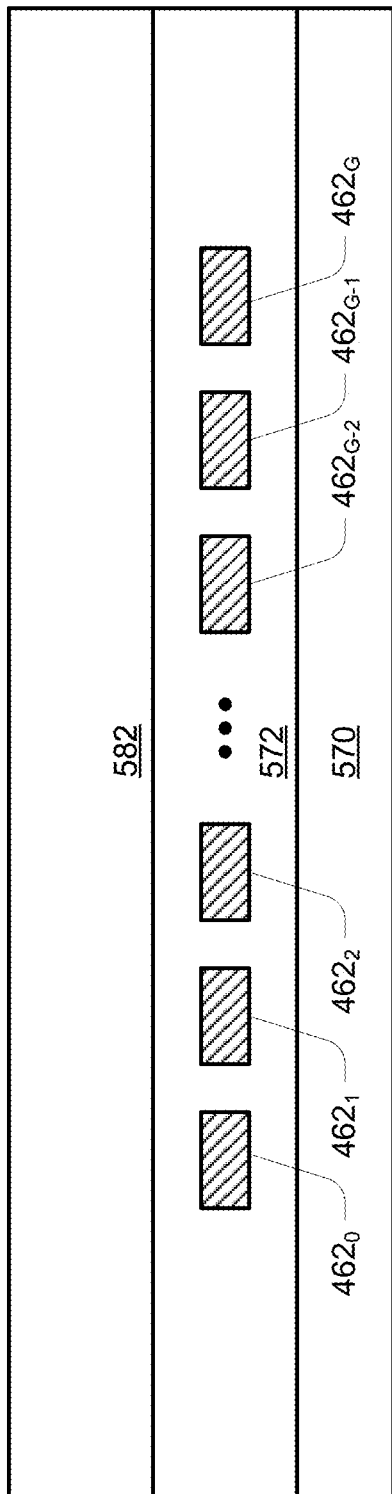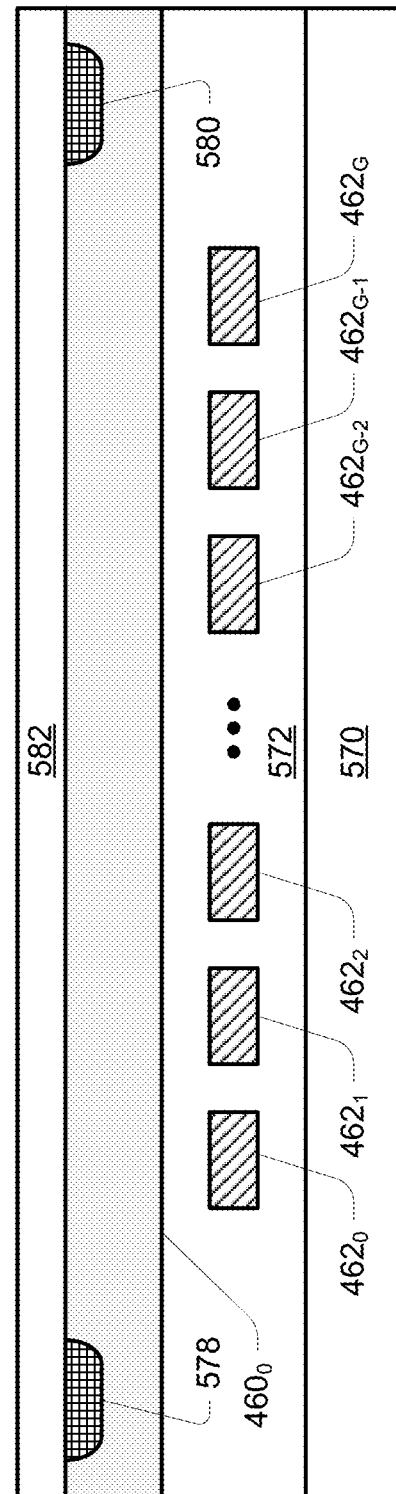

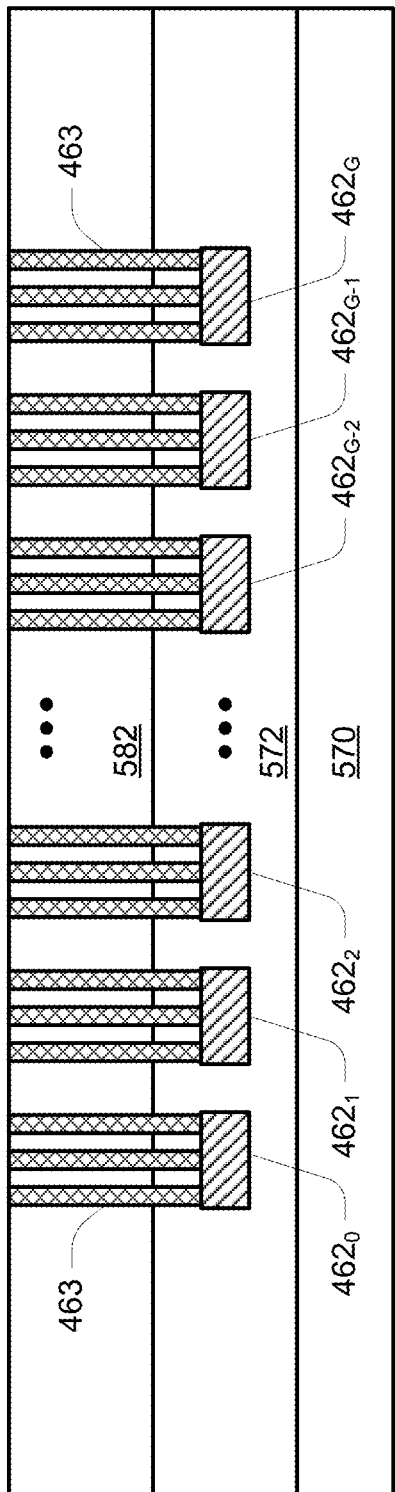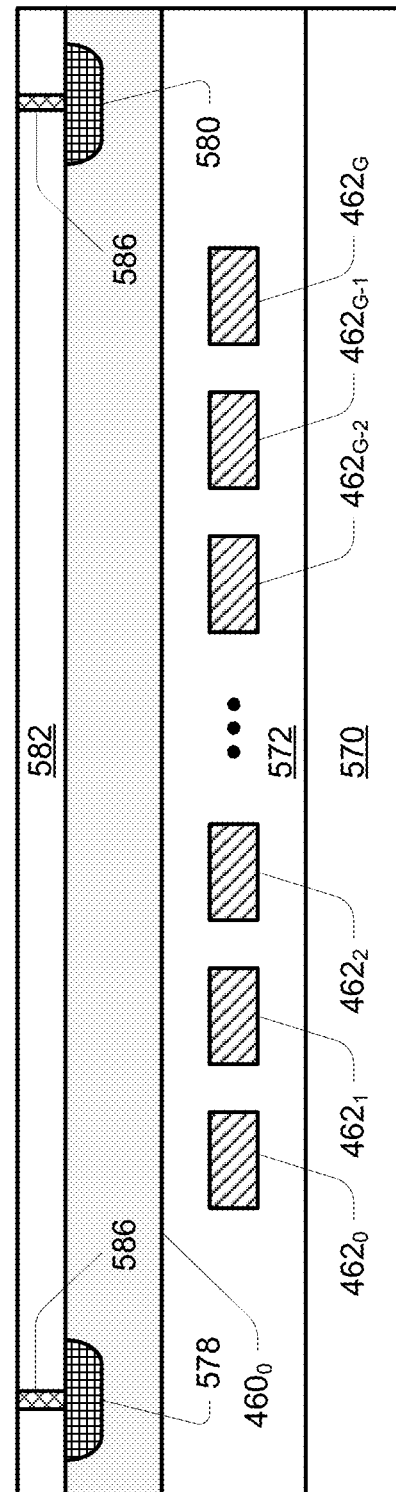

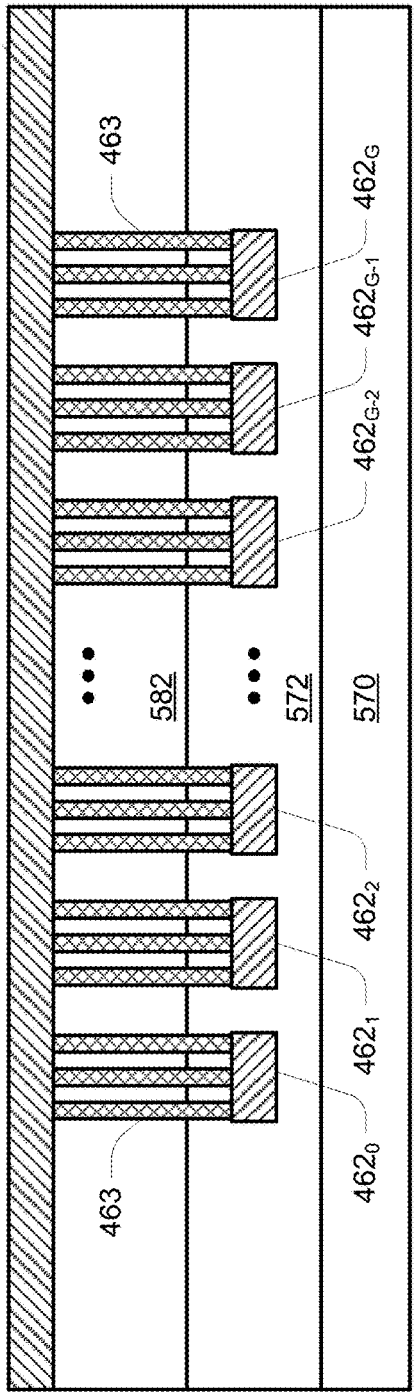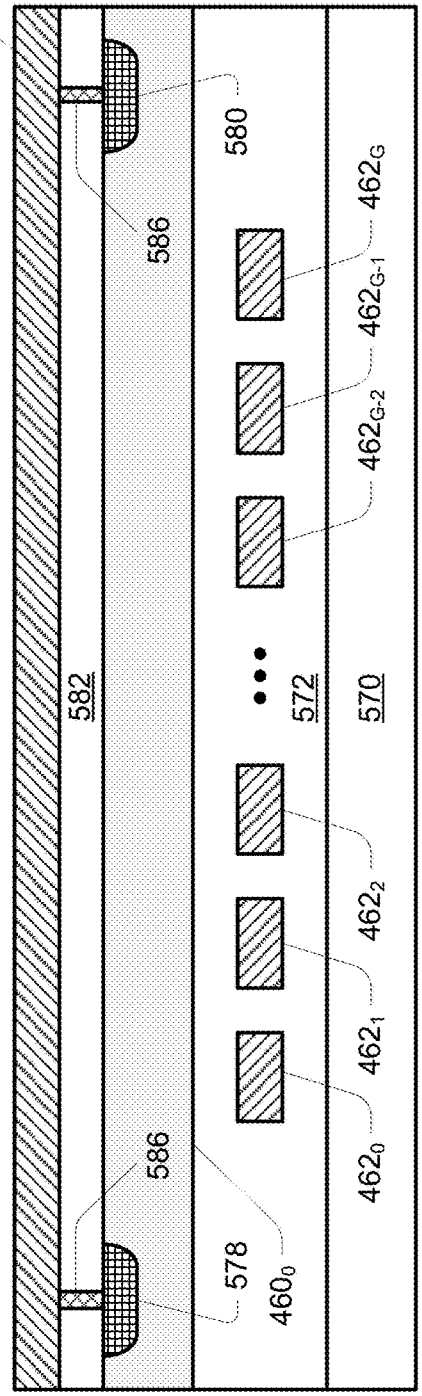

MULTI-GATE TRANSISTORS, APPARATUS HAVING MULTI-GATE TRANSISTORS, AND METHODS OF FORMING MULTI-GATE TRANSISTORS

TECHNICAL FIELD

The present disclosure relates generally to integrated circuits, and, in particular, in one or more embodiments, the present disclosure relates to multi-gate transistors, apparatus containing multi-gate transistors and methods of forming multi-gate transistors.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

In a memory device, access of memory cells (e.g., programming memory cells) often utilizes high voltage levels delivered to the control gates of those memory cells, which might exceed 20V. Gating such voltage levels often relies on transistors, such as field-effect transistors (FETs), having high breakdown voltages. Such transistors often utilize a relatively large footprint, and typically require overdrive voltages applied to their control gates in order to pass the full voltage level of a voltage node.

DETAILED DESCRIPTION

Figure 1:
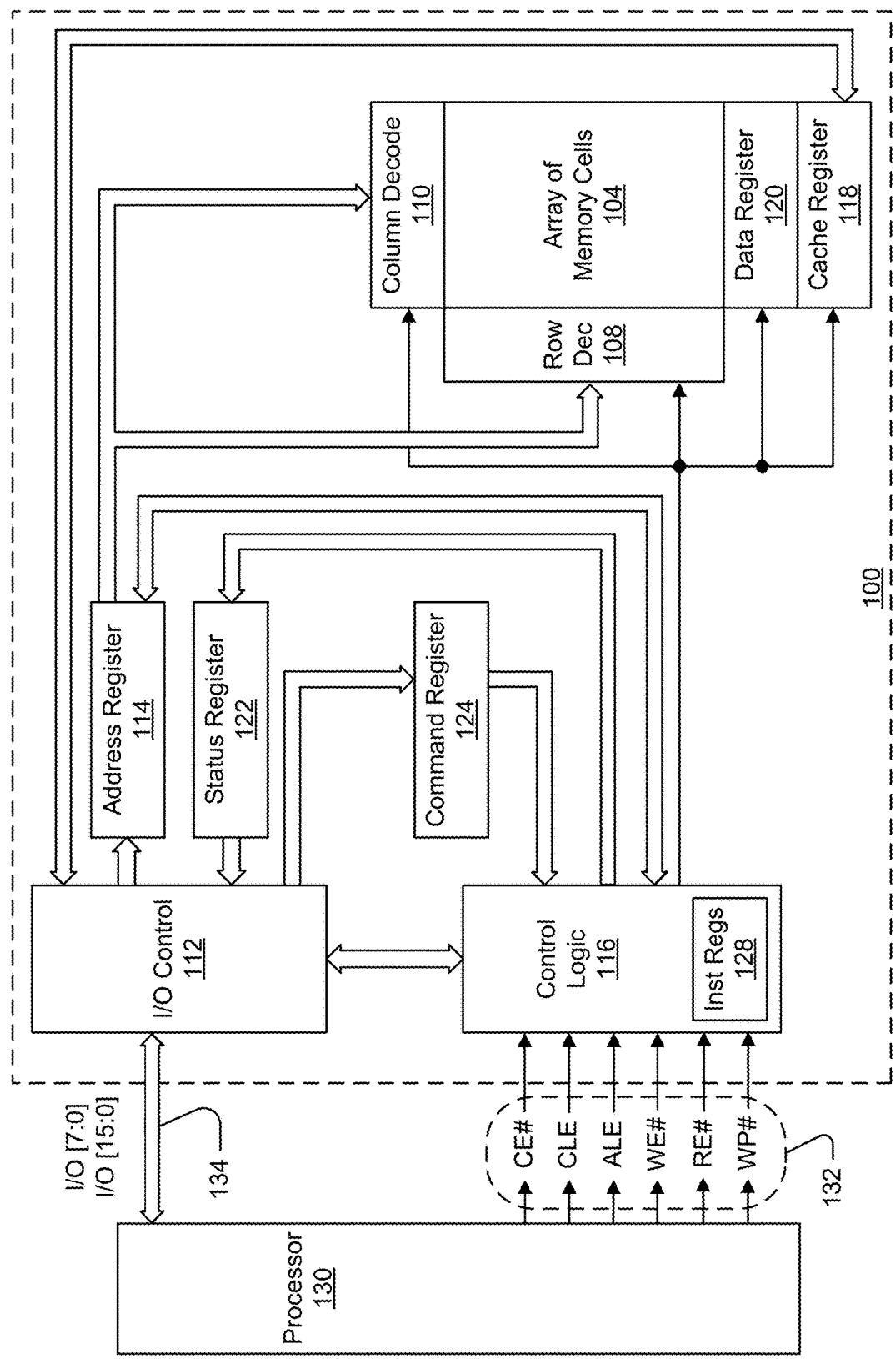
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by a conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Various embodiments might facilitate high breakdown voltage transistors, e.g., field-effect transistors (FETs), through the use of multiple gates along an active area providing a channel region of the transistor. While transistors of various embodiments might be utilized in all types of integrated circuit devices utilizing transistors, they will be described herein with specific reference to apparatus containing memory cells, some of which are commonly referred to as memory devices or simply memory.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
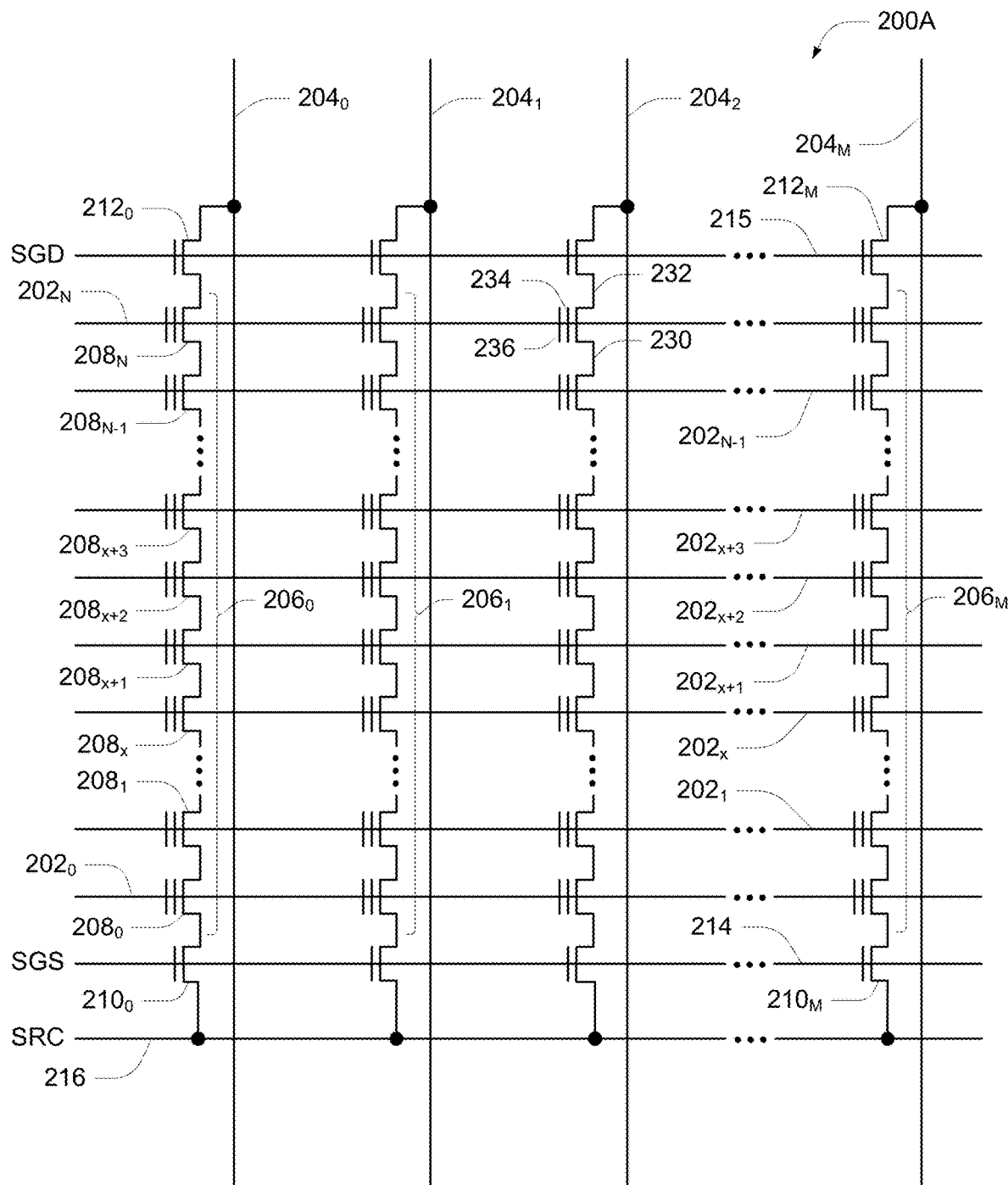
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The source 216 might represent a voltage node commonly selectively connected to the memory cells 208 of a plurality of NAND strings 206. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
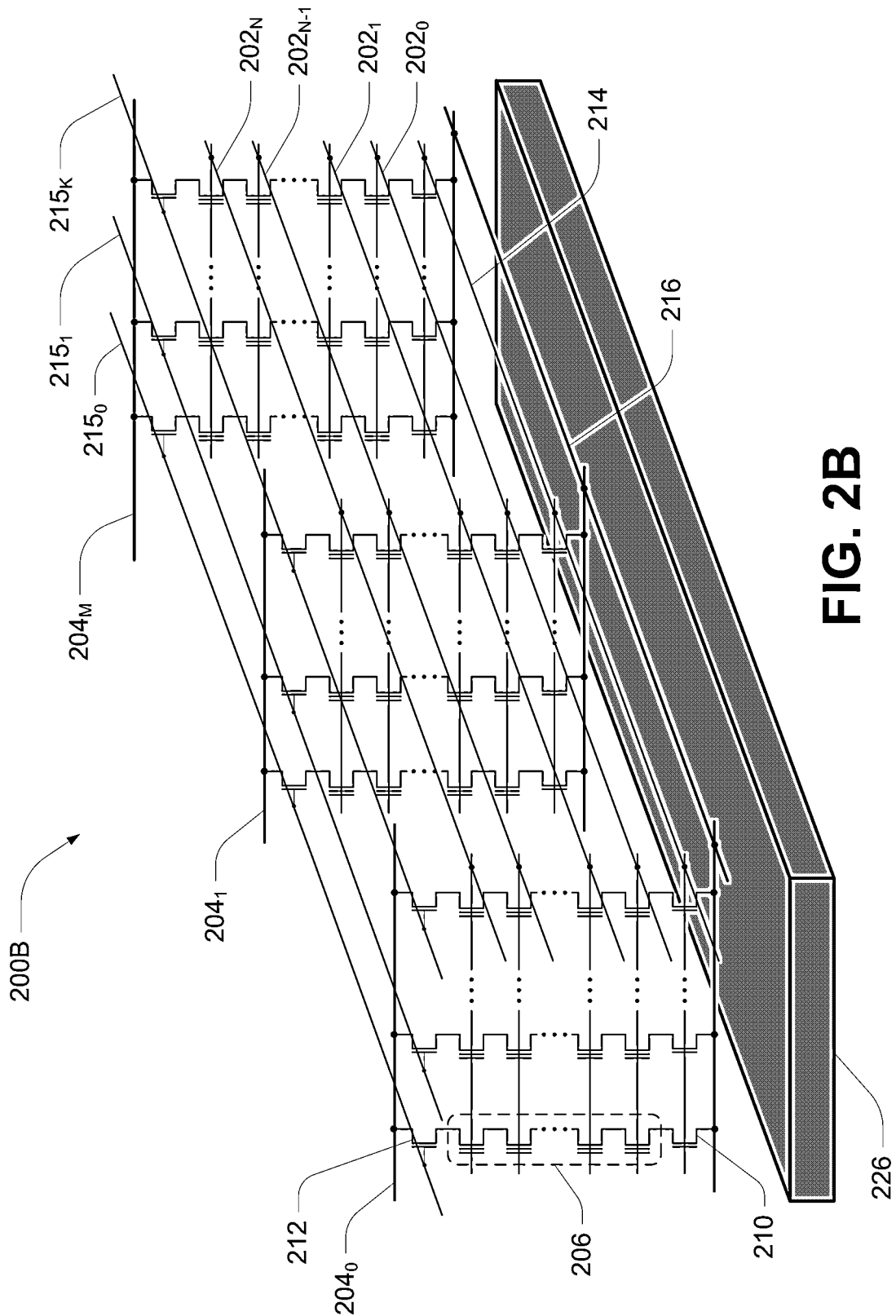

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
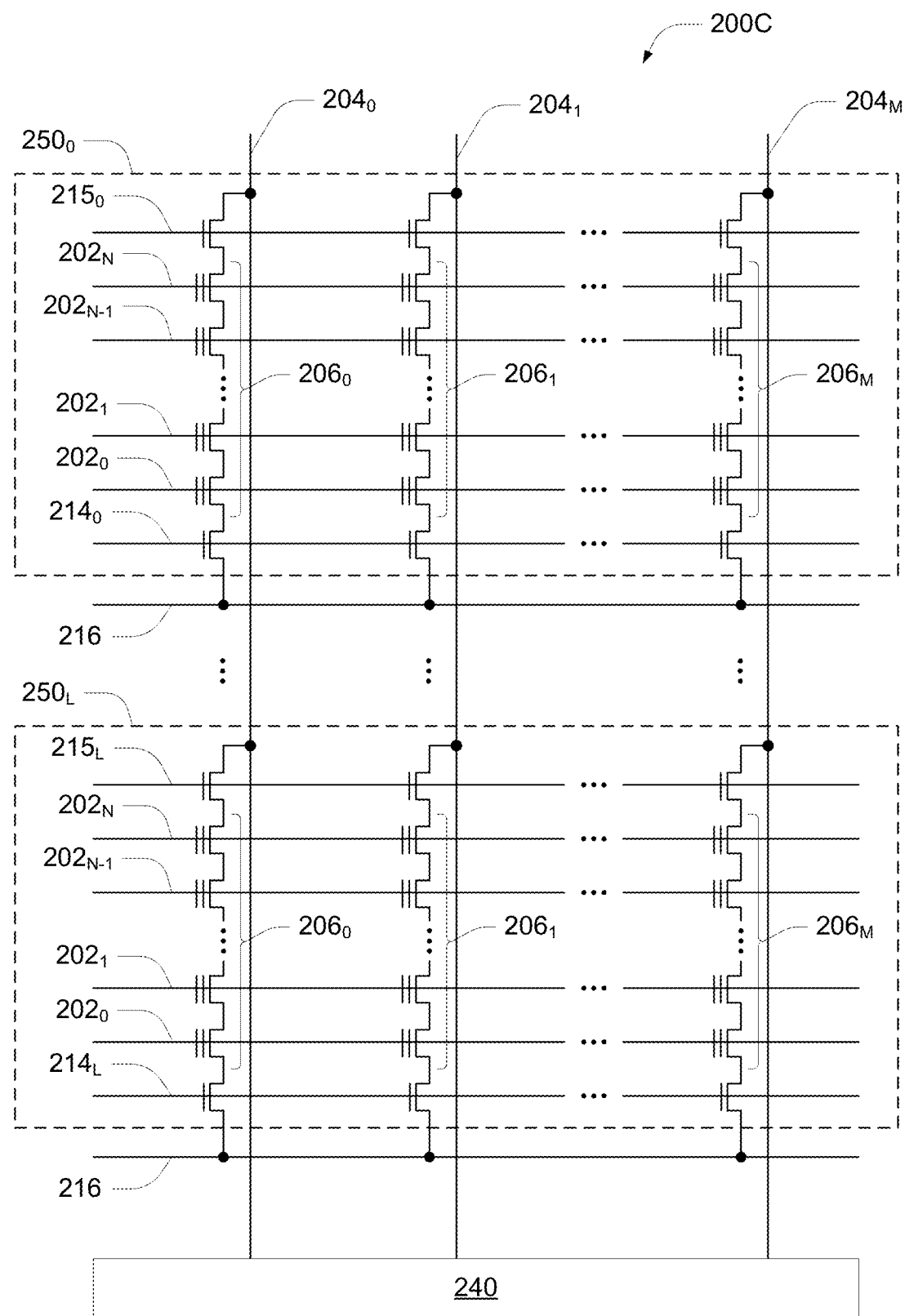

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $250_0$-$250_L$. Blocks of memory cells 250 might be groupings of memory cells 208 that might be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $250_0$-$250_L$.

The data lines $204_0$-$204_M$ might be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sensing devices (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3A:
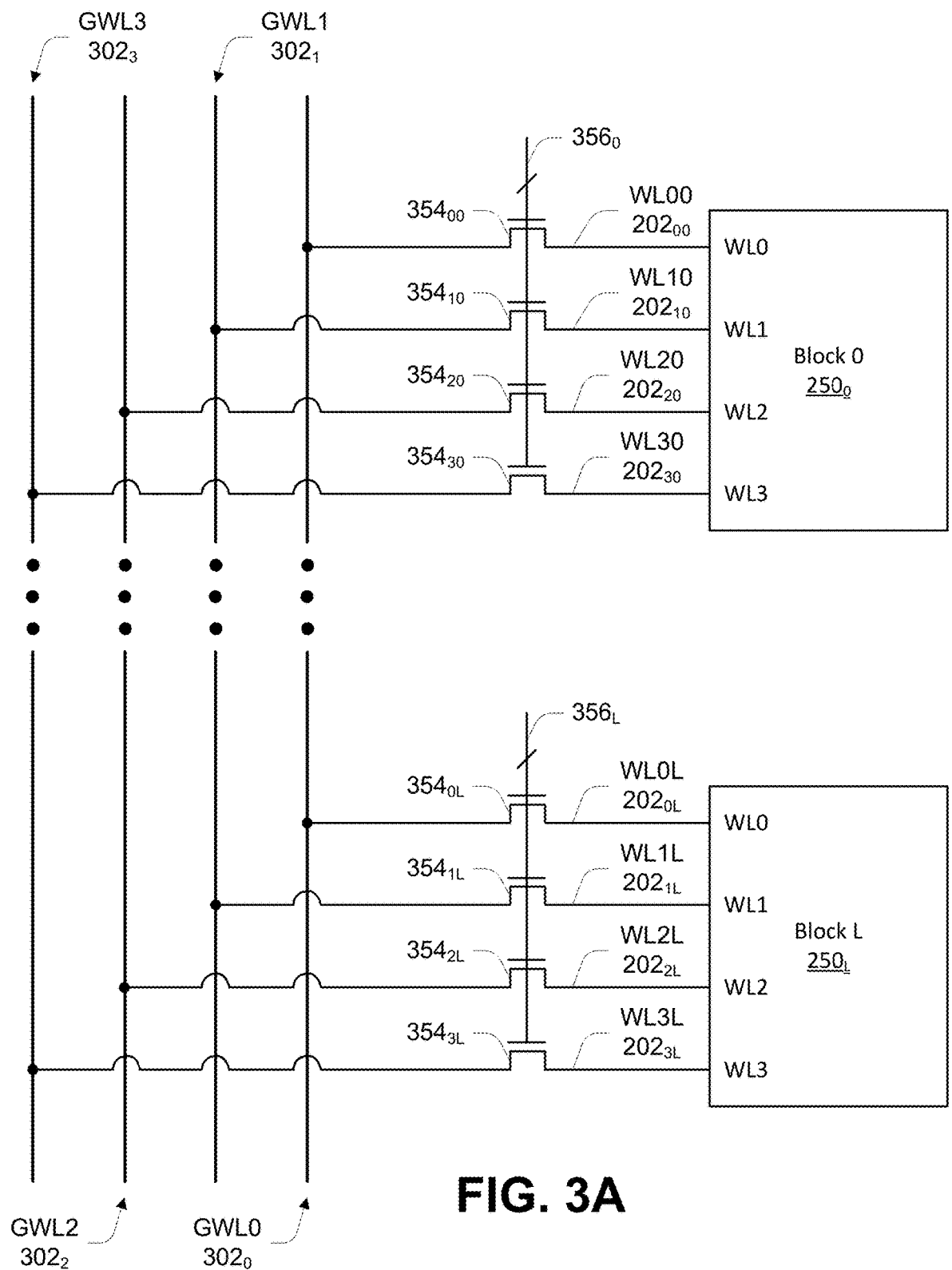
FIG. 3A is a schematic of a portion of an array of memory cells and string drivers as could be used in a memory device of the type described with reference to FIG. 1.

FIG. 3A is a schematic of a portion of an array of memory cells and string drivers as could be used in a memory device of the type described with reference to FIG. 1 and depicting a many-to-one relationship between local access lines (e.g., word lines 202) and global access lines (e.g., global word lines 302).

As depicted in FIG. 3A, a plurality of memory blocks 250 might have their local access lines (e.g., word lines 202) commonly selectively connected to a plurality of global access lines (e.g., global word lines 302). Although FIG. 3A depicts only memory blocks $250_0$ and $250_L$ (Block 0 and Block L), additional memory blocks 250 might have their word lines 202 commonly connected to global word lines 302 in a like manner. Similarly, although FIG. 3A depicts only four word lines 202, memory blocks 250 might include fewer or more word lines 202.

To facilitate memory access operations to specific memory blocks 250 commonly coupled to a given set of global word lines 302, each memory block 250 might have a corresponding set of block select transistors 354 in a one-to-one relationship with their word lines 202. Control gates of the set of block select transistors 354 for a given memory block 250 might have their control gates commonly coupled to a corresponding block select line 356. As discussed with reference to FIG. 4, the block select lines 356 (e.g., block select lines $356_0$-$356_L$) might each represent multiple independent conductors, each connected to a respective control gate of a multi-gate transistor.

For memory block $250_0$, word line $202_{00}$ might be selectively connected to global word line $302_0$ through block select transistor $354_{00}$, word line $202_{10}$ might be selectively connected to global word line $302_1$ through block select transistor $354_{10}$, word line $202_{20}$ might be selectively connected to global word line $302_2$ through block select transistor $354_{20}$, and word line $202_{30}$ might be selectively connected to global word line $302_3$ through block select transistor $354_{30}$, while block select transistors $354_{00}$-$354_{30}$ are responsive to control signals received on block select line $356_0$. For memory block $250_L$, word line $202_{0L}$ might be selectively connected to global word line $302_L$ through block select transistor $354_{0L}$, word line $202_{1L}$ might be selectively connected to global word line $302_1$ through block select transistor $354_{1L}$, word line $202_{2L}$ might be selectively connected to global word line $302_2$ through block select transistor $354_{2L}$, and word line $202_{3L}$ might be selectively connected to global word line $302_3$ through block select transistor $354_{3L}$, while block select transistors $354_{0L}$-$354_{3L}$ are responsive to control signals received on block select line $356_L$. The block select transistors 354 for a block of memory cells 250 might collectively be referred to as a string driver, or simply driver circuitry.

Figure 3B:
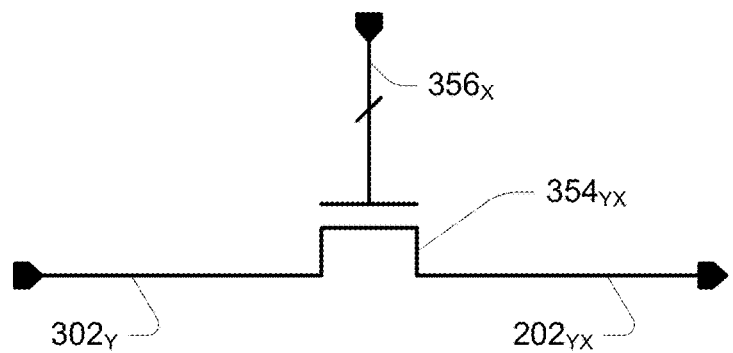
FIG. 3B is a schematic of a portion of one example of a string driver as could be used in a memory of the type described with reference to FIG. 1.

FIG. 3B is a schematic of a portion of one example of a string driver as could be used in a memory of the type described with reference to FIG. 1. The portion of the string driver of FIG. 3B depicts one transistor, e.g., block select transistor $354_{YX}$, responsive to a control signal node, e.g., block select line $356_X$, and connected between a voltage node, e.g., a global word line $302_Y$, configured to supply a voltage level, and load node, e.g., local word line $202_{YX}$, configured to receive that voltage level. For example, the block select transistor $354_{YX}$ might represent the block select transistor $354_{10}$ having control gates connected to the block select line $356_0$ and connected between the global word line $302_1$ and the local word line $202_{10}$ of the block of memory cells $250_0$. The block select transistor $356_{YX}$ might be a high-voltage junction-gate field-effect transistor or JFET. As discussed with reference to FIG. 4, the block select line $356_X$ might represent multiple independent conductors.

Figure 3C:
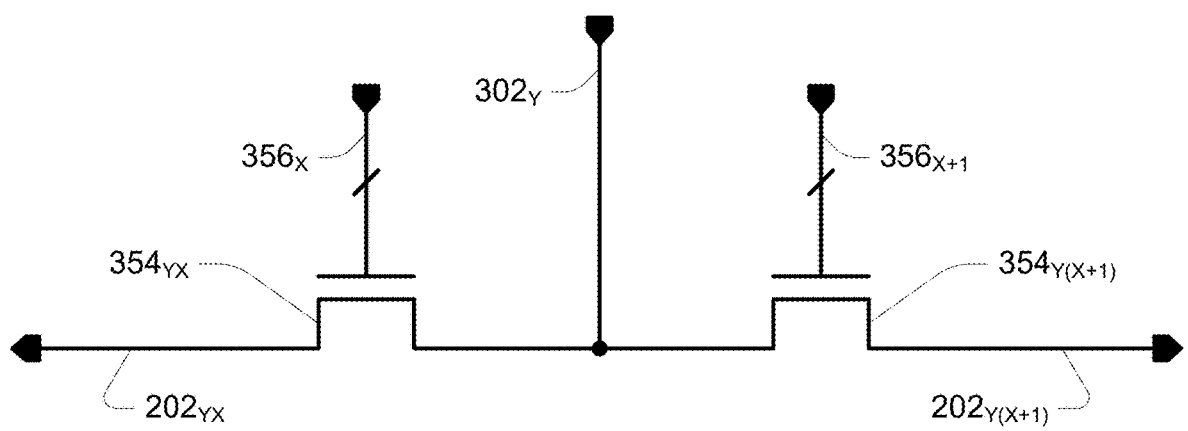
FIG. 3C is a schematic of a portion of another example of a string driver as could be used in a memory of the type described with reference to FIG. 1.

FIG. 3C is a schematic of a portion of another example of a string driver as could be used in a memory of the type described with reference to FIG. 1. The portion of the string driver of FIG. 3C depicts two transistors, e.g., block select transistor $354_{YX}$ and block select transistor $354_{Y(X+1)}$. Block select transistor $354_{YX}$ is responsive to a control signal node, e.g., block select line $356_X$, and connected between a voltage node, e.g., a global word line $302_Y$, configured to supply a voltage level, and load node, e.g., local word line $202_{YX}$, configured to receive that voltage level. For example, the block select transistor $354_{YX}$ might represent the block select transistor $354_{10}$ having control gates connected to the block select line $356_0$ and connected between the global word line $302_1$ and the local word line $202_{10}$ of the block of memory cells $250_0$.

Block select transistor $354_{Y(X+1)}$ is responsive to a control signal node, e.g., block select line $356_{X+1}$, and connected between a voltage node, e.g., the global word line $302_Y$, configured to supply a voltage level, and load node, e.g., local word line $202_{Y(X+1)}$, configured to receive that voltage level. For example, the block select transistor $354_{Y(X+1)}$ might represent the block select transistor $354_{1L}$ having control gates connected to the block select line $356_L$ and connected between the global word line $302_1$ and the local word line $202_{1L}$ of the block of memory cells $250_L$. The block select transistors $356_{YX}$ and $356_{Y(X+1)}$ might each be high-voltage JFETs. As discussed with reference to FIG. 4, the block select lines $356_X$ and $356_{X+1}$ might each represent multiple independent conductors.

Figure 4:
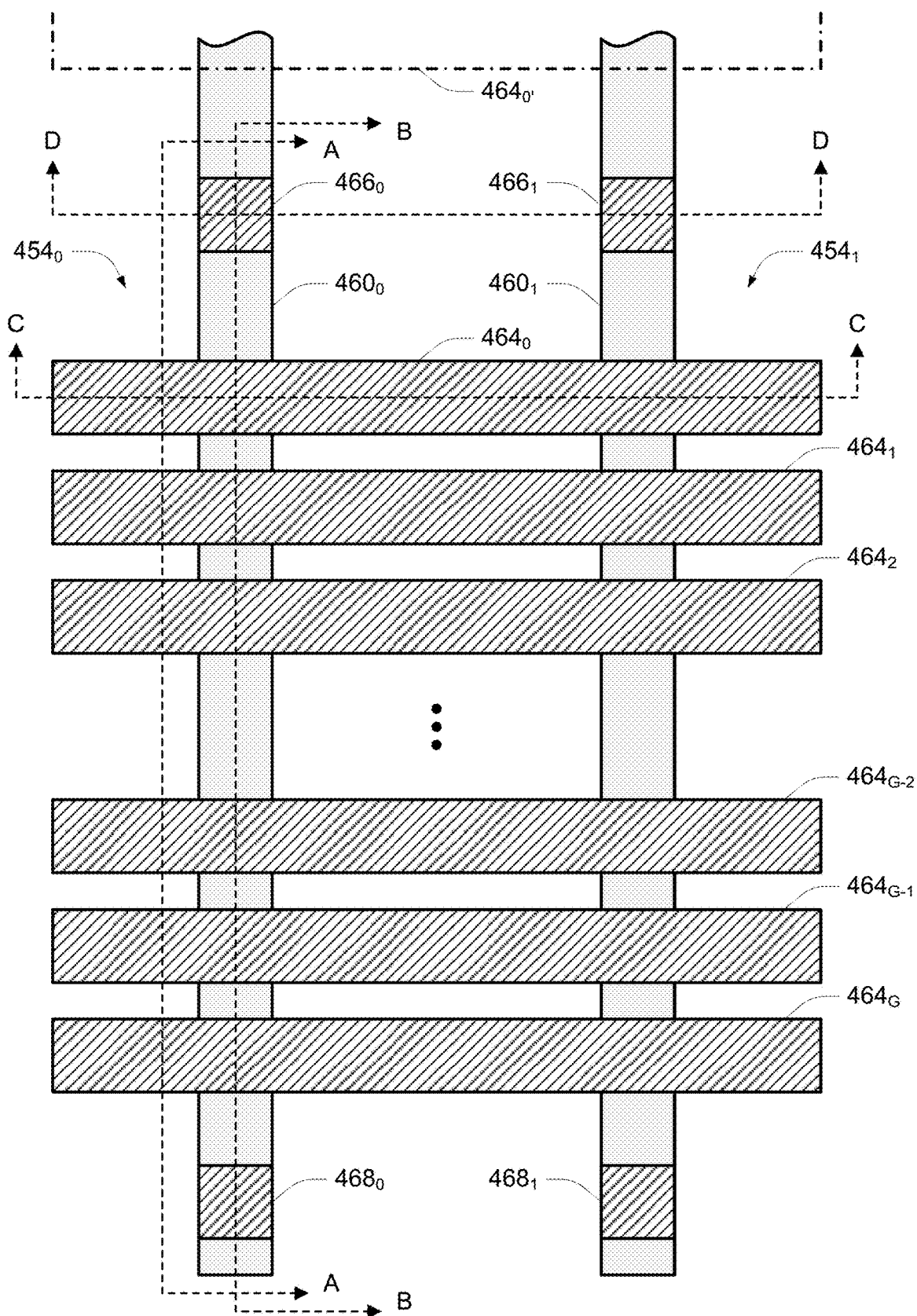
FIG. 4 is a plan view of multi-gate transistors in accordance with an embodiment.
Figure 5A:
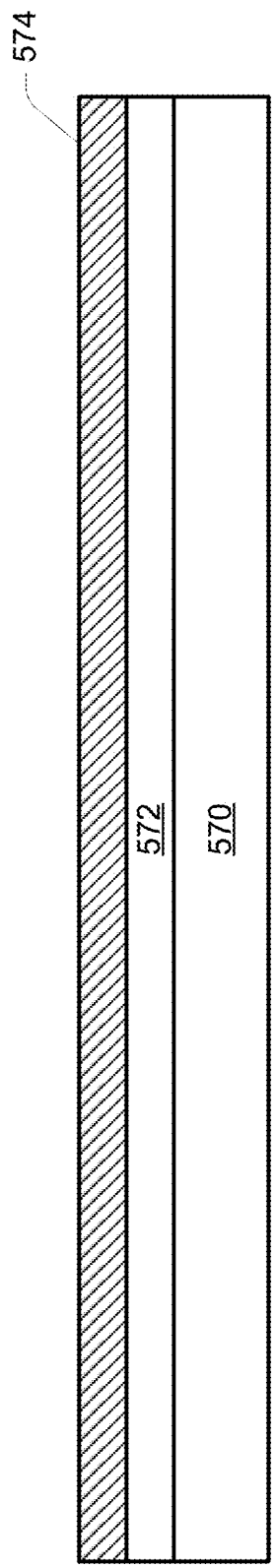
FIGS. 5A-12D are cross-sectional views of the transistors of FIG. 4 at various stages of fabrication in accordance with an embodiment.
Figure 5B:
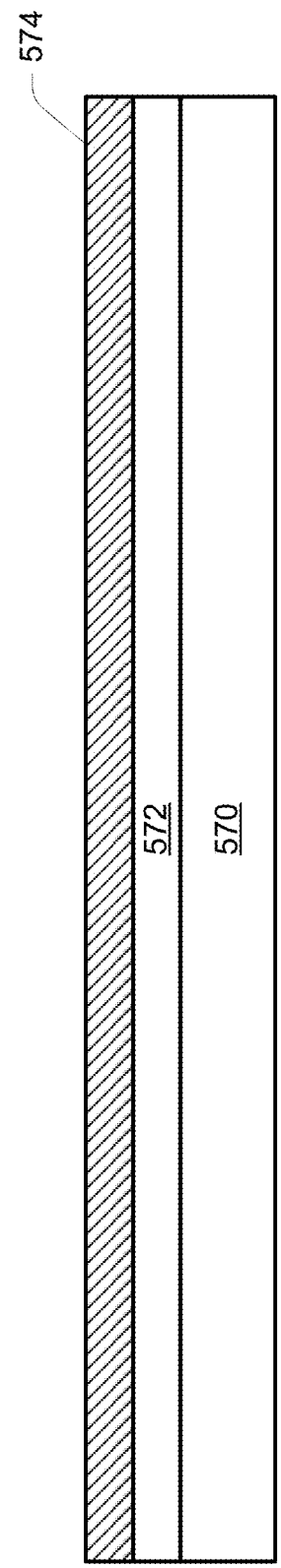
Figure 5C:
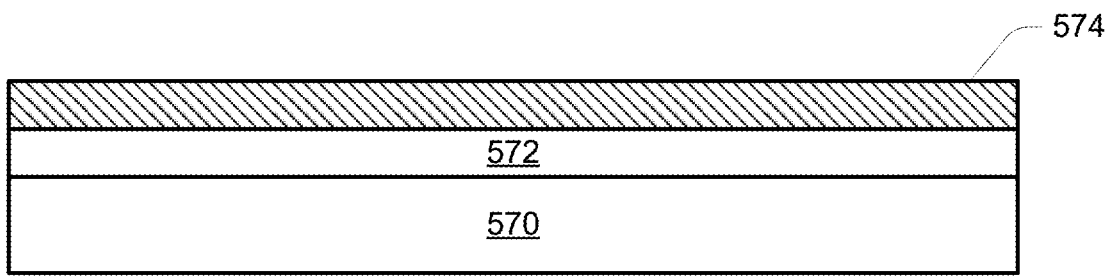
Figure 5D:
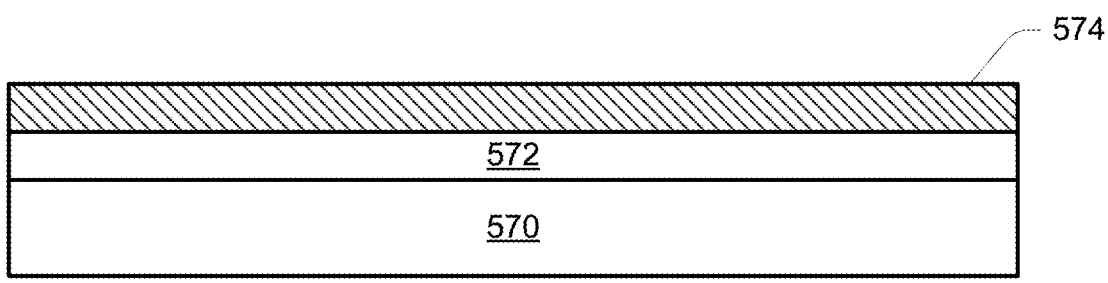
Figure 6C:
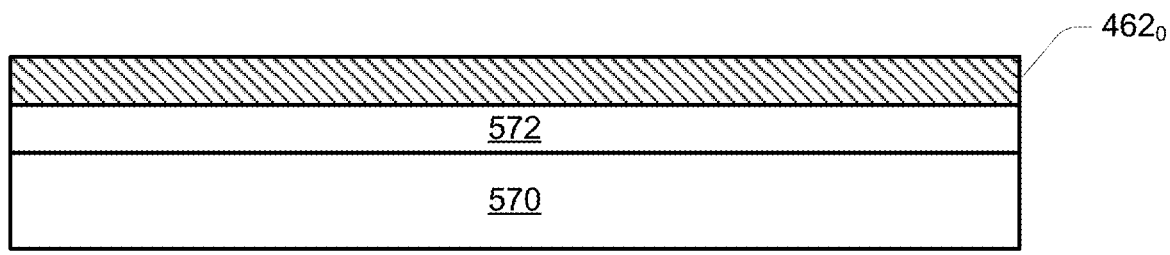
Figure 6D:
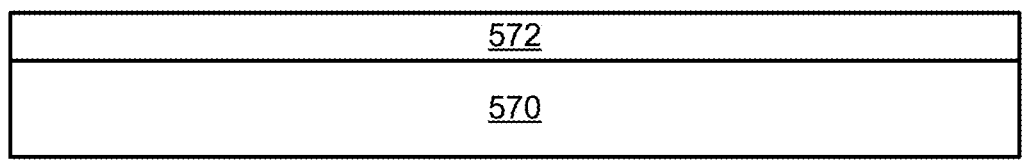
Figure 7C:
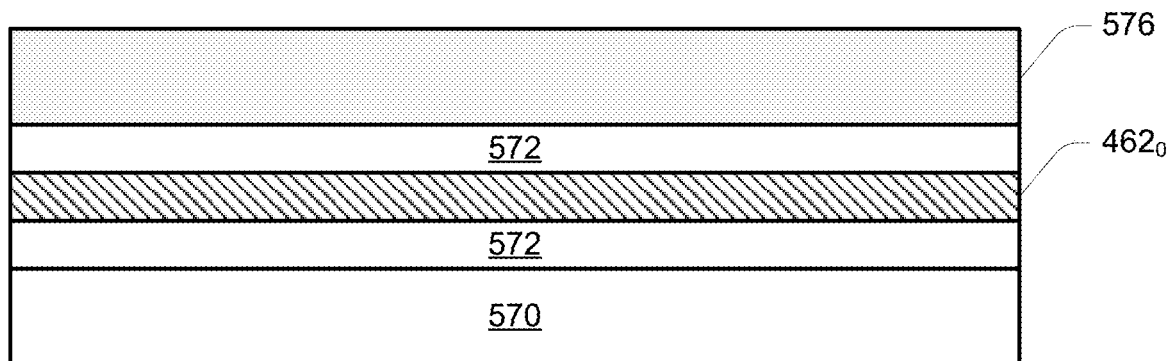
Figure 7D:
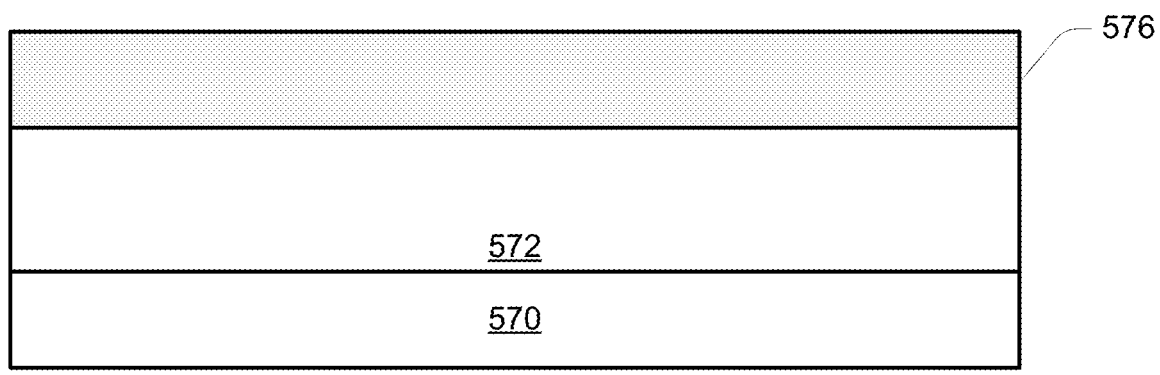
Figure 8A:
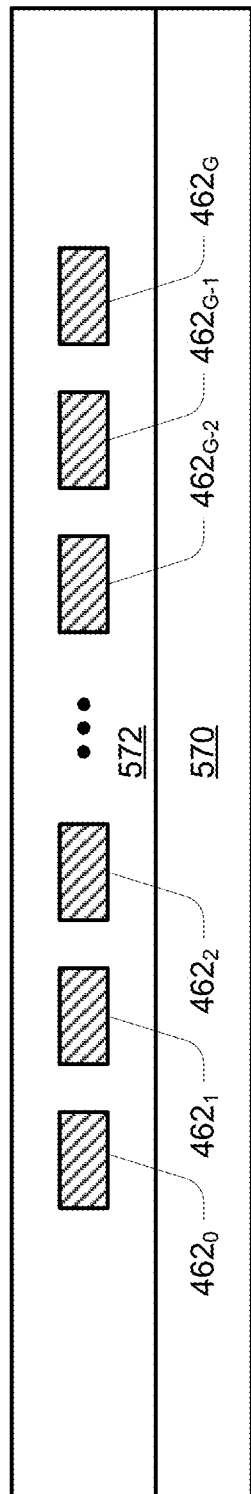
Figure 8B:
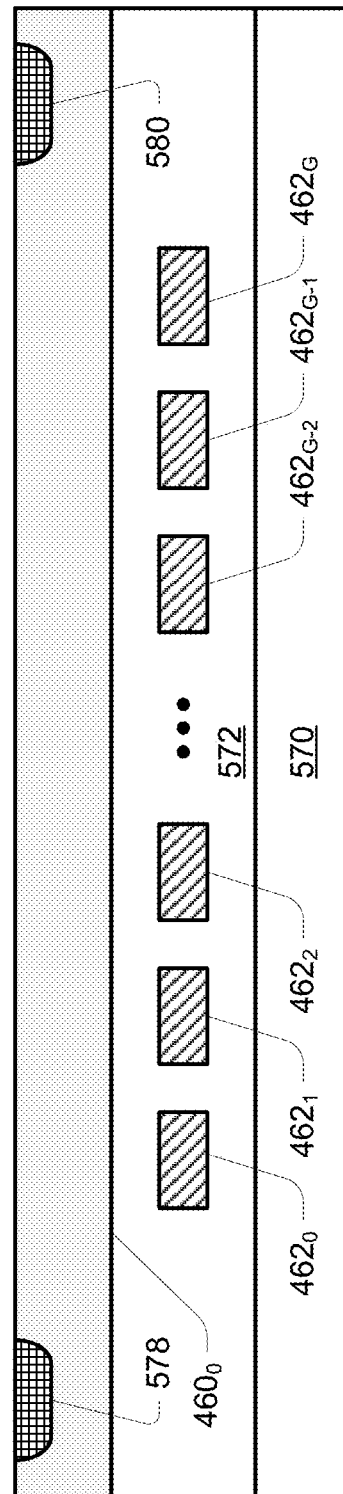
Figure 8C:
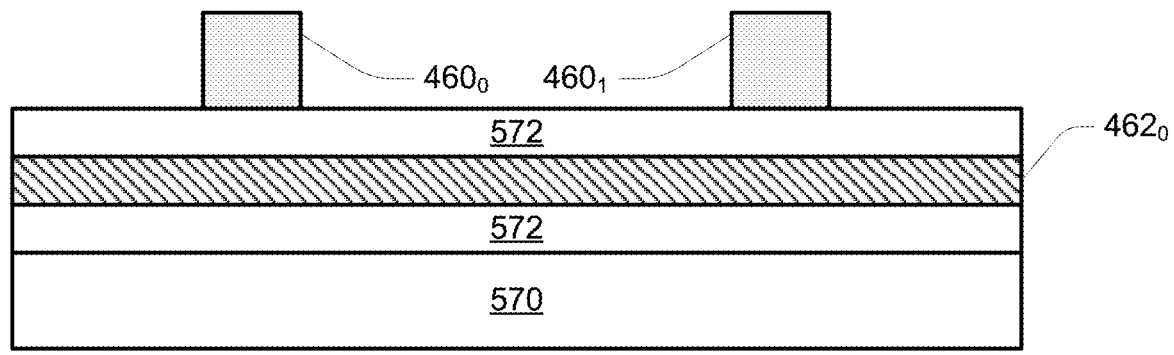
Figure 8D:
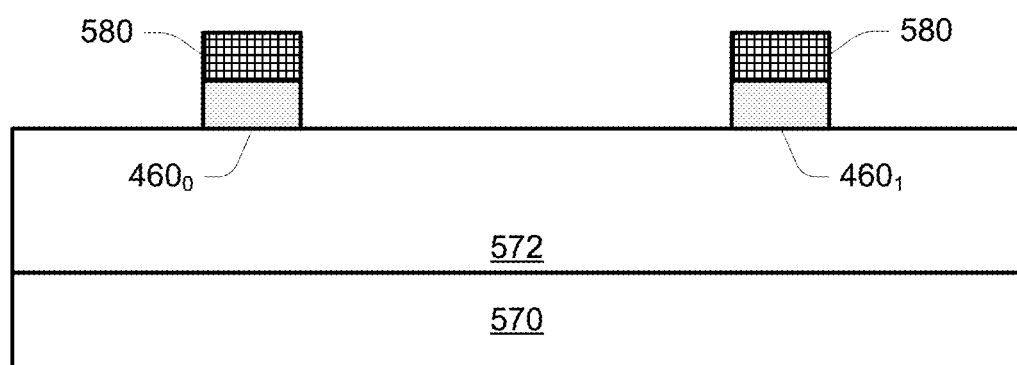
Figure 9C:
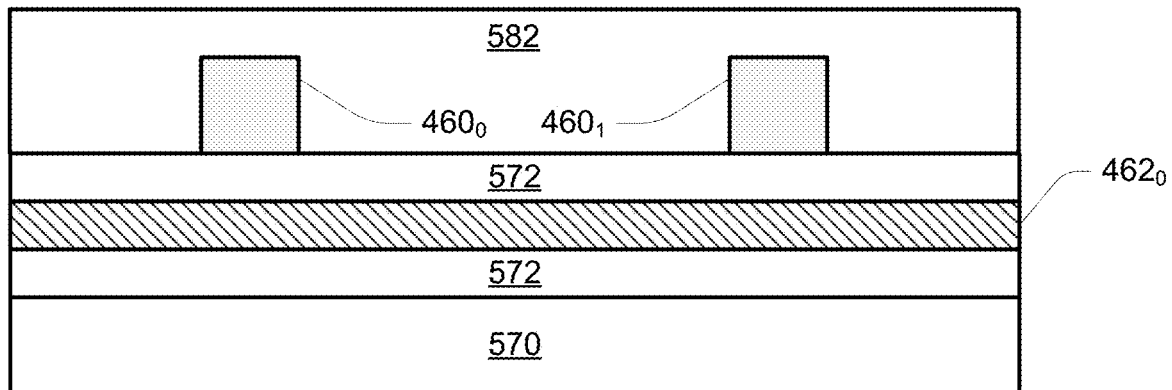
Figure 9D:
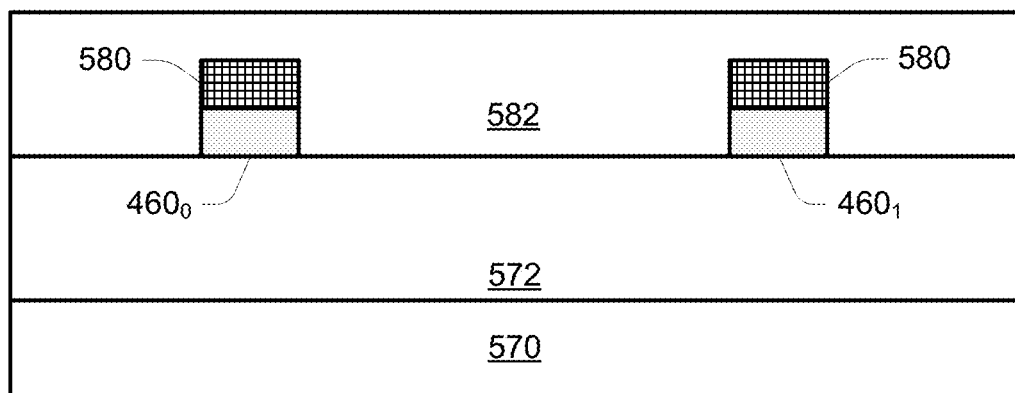
Figure 10C:
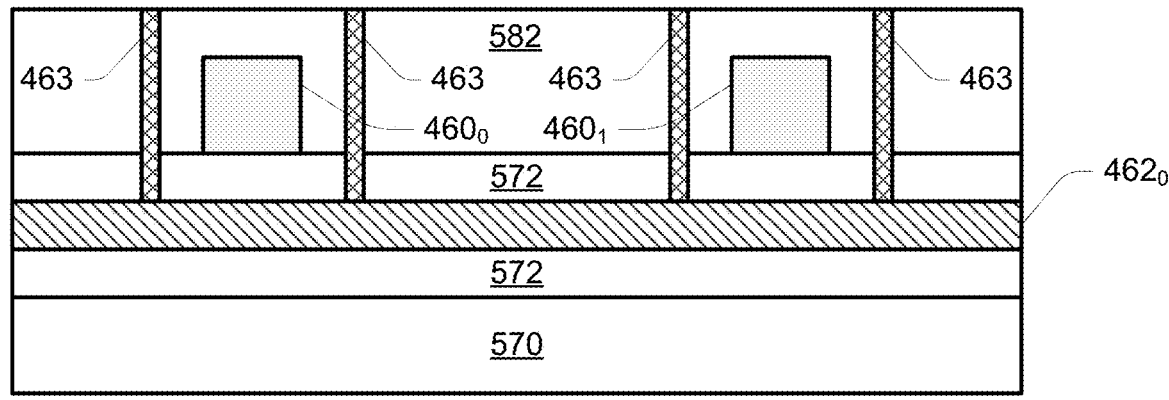
Figure 10D:
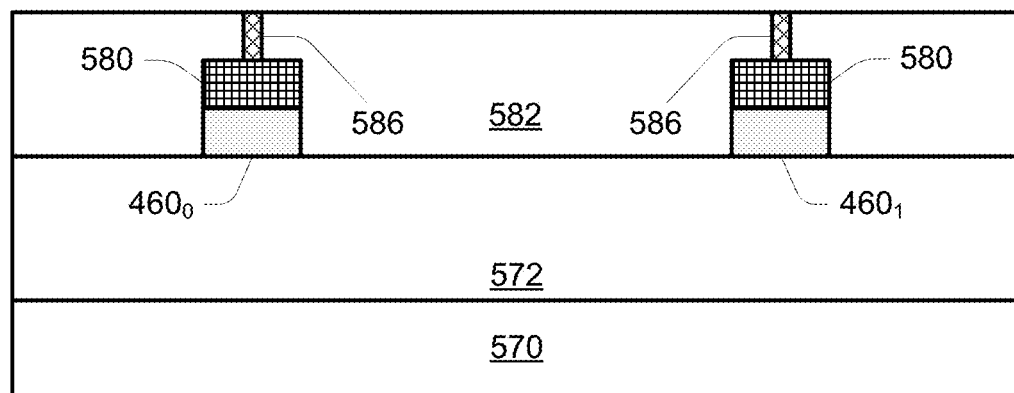
Figure 11C:
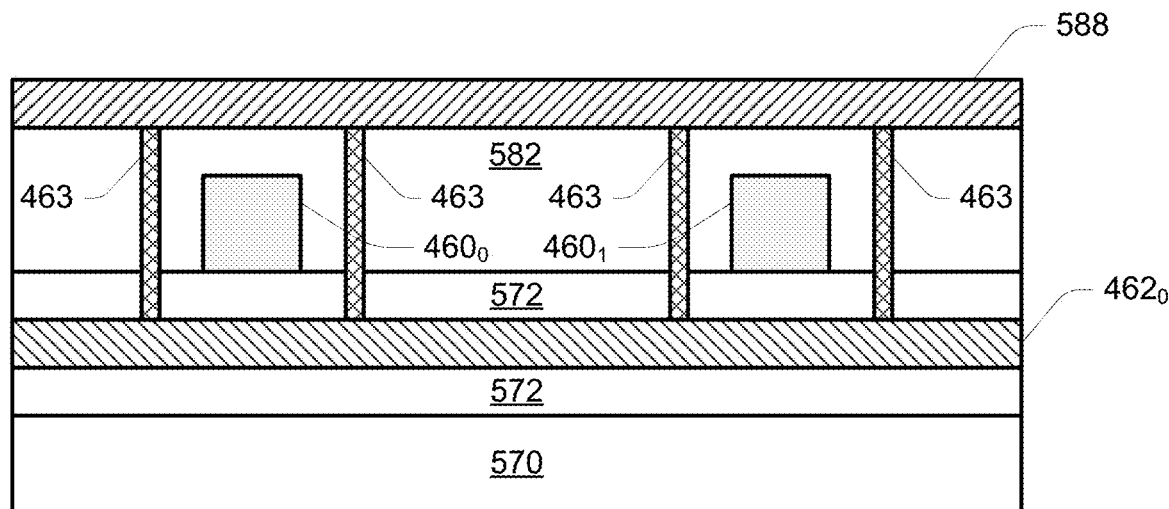
Figure 11D:
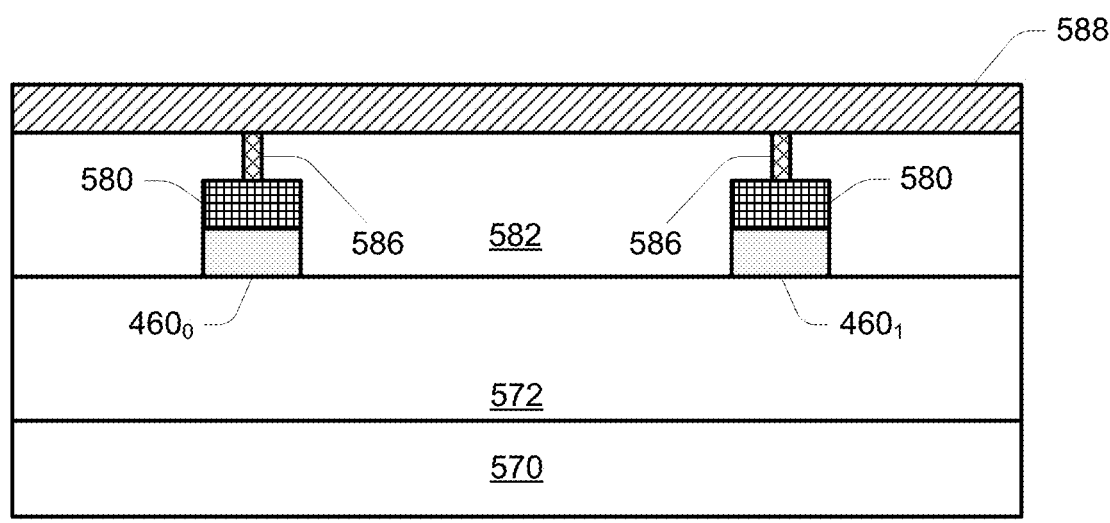

FIG. 4 is a plan view of transistors $454_0$ and $454_1$ in accordance with an embodiment. The transistors of FIG. 4 might be represented by a schematic such as depicted in FIG. 3C. In FIG. 4, the transistors 454 (e.g., transistors $454_0$ and $454_1$) each include an active area 460 (e.g., active areas $460_0$ and $460_1$, respectively) of a semiconductor, e.g., a conductively-doped semiconductor. Each transistor might be formed between a respective first contact $466_0$ or $466_1$, e.g., for connection to a respective voltage node, such as a global access line, and a respective second contact $468_0$ or $468_1$, e.g., for connection to a respective load node, such as a local access line. Such transistors might be responsive to control signals received on conductors 464, e.g., conductors $464_0$-$464_G$, which might be connected to (and might form) at least a portion of the control gates of one or more transistors. The conductors 464 might be independent from one another. For example, each conductor 464 might be configured to receive a control signal, e.g., an applied voltage level, that is independent of control signals for each remaining conductor 464. Collectively, the conductors $464_0$-$464_G$ might represent a block select line 356. The active areas $460_0$ and $460_1$ might extend to a second pair of adjacent transistors (not fully depicted in FIG. 4) sharing the first contacts $466_0$ and $466_1$, such as shown by the phantom line corresponding to a conductor $464_0$, of the second pair of adjacent transistors with the structure of the second pair of adjacent transistors being a mirror image of the transistors $454_0$ and $454_1$.

FIGS. 5A-12D are cross-sectional views of the transistors of FIG. 4 at various stages of fabrication in accordance with an embodiment. FIGS. 5A, 6A, 7A, 8A, 9A, 10A, 11A and 12A are cross sections taken along the line A-A in FIG. 4. FIGS. 5B, 6B, 7B, 8B, 9B, 10B, 11B and 12B are cross sections taken along the line B-B in FIG. 4. FIGS. 5C, 6C, 7C, 8C, 9C, 10C, 11C and 12C are cross sections taken along the line C-C in FIG. 4. FIGS. 5D, 6D, 7D, 8D, 9D, 10D, 11D and 12D are cross sections taken along the line D-D in FIG. 4.

Although the cross sections of FIGS. 5A, 6A, 7A, 8A, 9A, 10A, 11A and 12A depict a portion of the transistor $454_0$ from one side, these figures might further apply to a corresponding cross section of the other side of the transistor $454_0$, or either side of the transistor $454_1$, as both transistors might have a similar, e.g., the same, structure and might be symmetrical on either side of their active areas 460. Although the cross sections of FIGS. 5B, 6B, 7B, 8B, 9B, 10B, 11B and 12B depict a portion of the transistor $454_0$, these figures might further apply to a corresponding cross section of transistor $454_1$ as both transistors might have a similar, e.g., the same, structure. Although the cross sections of FIGS. 5C, 6C, 7C, 8C, 9C, 10C, 11C and 12C depict a portion of the transistors $454_0$ and $454_1$ containing the conductor $464_0$, these figures might further apply to a corresponding cross section of transistors $454_0$ and $454_1$ containing any of the remaining conductors $464_1$-$464_G$, as such portions of both transistors might have a similar, e.g., the same, structure. Although the cross sections of FIGS. 5D, 6D, 7D, 8D, 9D, 10D, 11D and 12D depict a portion of the transistors $454_0$ and $454_1$ containing the first contacts $466_0$ and $466_1$, respectively, these figures might further apply to a corresponding cross section of transistors $454_0$ and $454_1$ containing the second contacts $468_0$ and $468_1$, respectively, as such portions of both transistors might have a similar, e.g., the same, structure.

In FIGS. 5A-5D, a dielectric 572 might be formed overlying (e.g., on) a substrate 570. The substrate 570 might comprise silicon, such as monocrystalline silicon, or other semiconductor material. The semiconductor 570 might have a conductivity type, such as a p-type conductivity. The substrate 570 might be below the peripheral circuitry 226 of FIG. 2B for certain embodiments whose transistors are to be formed as a portion of that peripheral circuitry. Alternatively, the substrate 570 might include the memory array 200B of FIG. 2B for certain embodiments whose transistors are to be formed above that memory array.

The dielectric 572 might be formed of one or more dielectric materials. For example, the dielectric 572 might comprise, consist of, or consist essentially of an oxide, e.g., silicon dioxide, and/or might comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material.

A conductor 574 might be formed overlying (e.g., on) the dielectric 572. The conductor 574 might be formed of one or more conductive materials. The conductor 574 might comprise, consist of, or consist essentially of conductively doped polycrystalline silicon (polysilicon) and/or might comprise, consist of, or consist essentially of metal, such as a refractory metal, or a metal-containing material, such as a refractory metal silicide or a metal nitride, e.g., a refractory metal nitride, as well as any other conductive material. As an example, the conductor 574 might contain tungsten or aluminum. For one embodiment, where the transistors are to be formed under a memory array, the conductor 574 might include tungsten. For another embodiment, where the transistors are to be formed over a memory array, the conductor 574 might include aluminum. In general, conductive materials, e.g., metals, having lower thermal budgets of formation, might be preferred in situations where the array of memory cells has already been formed. Such conductive materials might have lower thermal budgets of formation relative to conductive materials, e.g., metals, formed under the array of memory cells.

In FIGS. 6A-6D, the conductor 574 might be patterned to define a first portion of each control gate of the future transistors. For example, the conductor 574 might be patterned to define lower control gate portions $462_0$-$462_G$ of the future transistor as a first control gate portion of a control gate. A number of control gates for the future transistor might contain G+1 lower control gate portions. The variable G might represent an integer value greater than or equal to one. For some embodiments the variable G might represent an integer greater than or equal to five. The value of the variable G might be determined in response to a breakdown characteristic corresponding to the control gates of the finished transistor. For example, if a breakdown voltage between adjacent control gates is X volts, and an expected maximum Vds is Y volts, the variable G might be selected to be an integer value that is equal to or greater than Y/X.

Patterning the conductor 574 might include forming a patterned mask (not depicted) formed overlying (e.g., on) the conductor 574 to expose areas of the conductor 574 for removal. The mask might represent a mask formed using a photolithographic process. Photolithographic processes are often used to define a desired pattern in integrated circuit fabrication. In a photolithographic process, a photoresist layer might be formed on the surface of the in-process device. The photoresist layer might contain a photo-sensitive polymer whose ease of removal is altered upon exposure to light or other electromagnetic radiation. To define the pattern, the photoresist layer might be selectively exposed to radiation and then developed to expose portions of the underlying layer. In a positive resist system, the portions of the photoresist layer exposed to the radiation are photosolubilized and a photolithographic mask is designed to block the radiation from those portions of the photoresist layer that are to remain after developing. In a negative resist systems, the portions of the photoresist layer exposed to the radiation are photopolymerized and the photolithographic mask is designed to block the radiation from those portions of the photoresist layer that are to be removed by developing.

The exposed areas of the conductor 574 might be removed, e.g., anisotropically, to define the lower control gate portions $462_0$-$462_G$. For example, a reactive ion etch process might be used to remove portions of the conductor 574 not covered by the patterned mask. The mask might subsequently be removed, e.g., by ashing or otherwise removing the photoresist material.

In FIGS. 7A-7D, the dielectric 572 might be extended, such as by forming additional dielectric material overlying, e.g., on, the lower control gate portions $462_0$-$462_G$ and overlying, e.g., on, the dielectric 572 of FIGS. 6A-6D. A semiconductor material 576 might then be formed overlying, e.g., on, the dielectric 572 as depicted in FIGS. 7A-7D. The semiconductor material 576 might comprise silicon, such as monocrystalline, amorphous or polycrystalline silicon, or other semiconductor material, such as silicon germanium (SiGe). Other semiconductor materials might include indium zinc oxide (commonly referred to as InZnO or InZO), zinc oxide (ZnO), indium gallium zinc oxide (commonly referred to as InGaZnO or IGZO), molybdenum disulfide ($MoS_2$), molybdenum diselenide ($MoSe_2$), tungsten disulfide ($WS_2$), tungsten diselenide ($WSe_2$), graphene, carbon nanotubes, etc. The semiconductor material 576 might have a first conductivity type, such as a p-type conductivity. The semiconductor material 576 might be conductively doped during or after formation. To produce a p-type conductivity, the dopant species might include ions of boron (B) or another p-type impurity. For example, a semiconductor material 576 might be conductively doped during formation by adding diborane ($B_2H_6$) to the reaction gases of a CVD process to form the semiconductor material 576 in order to incorporate sufficient boron into the semiconductor material 576 to achieve a desired threshold voltage of the future transistor, e.g., a dopant concentration of undoped to 2 E18/cm$^3$ might be used. As an alternate example, a semiconductor material 576 might be conductively doped after formation by implanting one or more dopant species into the semiconductor material 576. As is well understood in the art, such implantation might commonly involve acceleration of ions directed at a surface of the semiconductor material 576. To produce an n-type conductivity, the dopant species might include ions of arsenic (As), antimony (Sb), phosphorus (P) or another n-type impurity In FIGS. 8A-8D, the conductively-doped semiconductor material 576 might be patterned to define the active areas $460_0$ and $460_1$. Patterning of the conductively-doped semiconductor material 576 might be performed in a manner similar to that discussed with reference to FIGS. 6A-6D. A first source/drain region 578, e.g., a source region, and a second source/drain region 580, e.g., a drain region, might be formed in each of the active areas $460_0$ and $460_1$ and might have a second conductivity type different than the first conductivity type. For example, where the first conductivity type is a p-type conductivity, the second conductivity type might be an n-type conductivity.

Forming the source/drain regions 578 and 580 might include conductively doping portions of the active areas $460_0$ and $460_1$. For example, the first source/drain region 578 and the second source/drain region 580 might be formed by implanting one or more dopant species into an active area 460. To produce an n-type conductivity, a dopant species might include ions of arsenic (As), antimony (Sb), phosphorus (P) or another n-type impurity. The doping levels of the first source/drain region 578 and the second source/drain region 580 might be higher than the doping levels of their active area 460. As one example, the doping levels of the first source/drain region 578 and the second source/drain region 580 might be 2 E18-1 E21/cm$^3$. Although the first source/drain region 578 and the second source/drain region 580 are depicted to extend into the active areas $460_0$ and $460_1$ less than their thickness, e.g., as measured from a top surface to a bottom surface of the active areas 460 as viewed in FIGS. 8B and 8D, for some embodiments, the first source/drain region 578 and the second source/drain region 580 might extend the full thickness of the active areas $460_0$ and $460_1$.

In FIGS. 9A-9D, a dielectric 582 might be formed overlying, e.g., on, the structure of FIGS. 8A-8D. The dielectric 582 might be formed of one or more dielectric materials, such as discussed with reference to dielectric 572.

In FIGS. 10A-10D, conductive vias 463 might be formed in the dielectric 582 to be in contact with the lower control gate portions $462_0$-$462_G$. One or more conductive vias 463 might be in contact with each lower control gate portion 462. Conductive vias 586 might further be formed, e.g., concurrently with the conductive vias 463, in the dielectric 582 to be in contact with the first source/drain regions 578 and second source/drain regions 580. For example, openings might be formed in the dielectric 582 to each individually expose a portion of the first source/drain region 578, the second source/drain region 580, or a lower control gate portion $462_0$-$462_G$, and then the openings might be filled or lined with conductive material. For one embodiment, the conductive vias 463 and 586 might each contain conductively-doped polysilicon, e.g., an n-type conductively-doped polysilicon, although other conductive materials might also or alternatively be used. As one example, the doping levels of the conductive vias 463 and 586 might be 2 E18-1 E21/cm$^3$. The conductive vias 463 might form a second and a third control gate portion of the control gates of the future transistor, e.g., side control gate portions, and might be referred to as such.

In FIGS. 11A-11D, a conductor 588 might be formed overlying (e.g., on) the dielectric 582. The conductor 588 might be formed of one or more conductive materials. The conductor 588 might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material. As an example, the conductor 588 might contain tungsten or aluminum. For one embodiment, where the transistors are to be formed under a memory array, the conductor 588 might include tungsten. For another embodiment, where the transistors are to be formed over a memory array, the conductor 588 might include aluminum. In general, conductive materials, e.g., metals, having lower thermal budgets of formation, might be preferred in situations where the array of memory cells has already been formed. Such conductive materials might have lower thermal budgets of formation relative to conductive materials, e.g., metals, formed under the array of memory cells.

In FIGS. 12A-12D, the conductor 588 might be patterned to define a fourth portion of each control gate of the transistor. For example, the conductor 588 might be patterned to define conductors, or upper control gate portions, $464_0$-$464_G$ of the transistors, as well as the first contacts $466_0$-$466_1$, and the second contacts $468_0$-$468_1$. Patterning the conductor 588 might be performed in a manner such as described with reference to the patterning of the conductor 574.

FIGS. 12A-12D depict transistors each having multiple independent control gates surrounding (e.g., lower, side and upper surfaces of) an active area 460. Collectively, a lower control gate portion 462 adjacent an active area 460, its corresponding side control gate portions 463 adjacent that active area 460, and its corresponding upper control gate portion 464 adjacent that active area, might define one control gate 465 (e.g., of control gates $465_{00}$-$465_{G0}$ of FIG. 12A) of a transistor 454 containing that active area 460. As one example, the lower control gate portion $462_0$ adjacent a bottom surface of the active area $460_0$, the side control gate portions 463 adjacent left and right surfaces of the active area $460_0$, and the upper control gate portion $464_0$ adjacent a top surface of the active area $460_0$, might collectively define a control gate $465_{00}$ of the transistor $454_0$. For each control gate 465, its lower control gate portion 462 might be in a plane parallel to a plane containing its upper control gate portion 464, and its side control gate portions 463 might be in different planes that are each orthogonal to the planes of the lower control gate portion 462 and the upper control gate portion 464.

For one embodiment, lengths of the control gates (e.g., as measured in a left-to-right direction of FIG. 12A) might be 0.15 µm with a spacing between adjacent control gates of 0.05 µm. The control gates might be spaced apart from the surfaces of the active area 460 by 0.04 µm, e.g., by a dielectric material. For some embodiments, the lower portions of the control gates might be spaced apart from the lower surface of the active area 460 by a greater distance than the side and upper surfaces. For example, the lower portions of the control gates might be spaced apart from the lower surface of the active area 460 by 0.14 µm. The active areas 460 might have a cross section of 0.07 µm by 0.07 µm. Although specific examples of dimensions are provided, such dimensions are not essential, and other dimensions could be used in response to desired operational characteristics, or in response to advancements in the ability to reliably define smaller device dimensions.

Figure 12A:
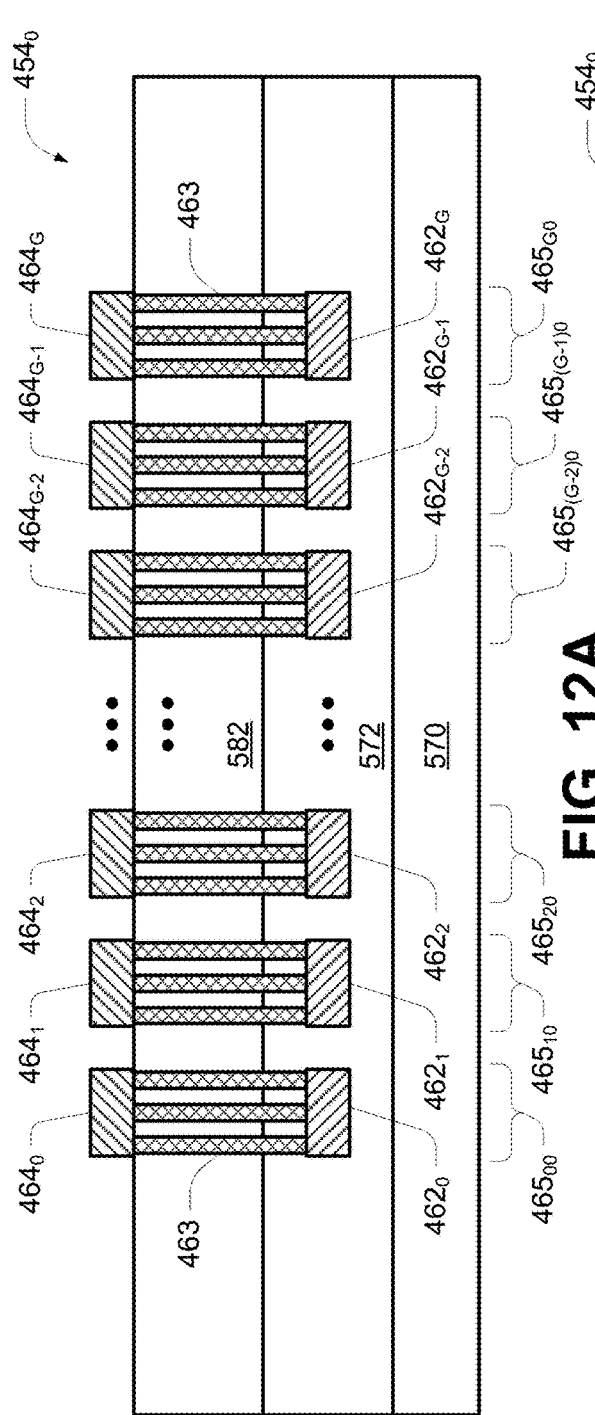
Figure 12B:
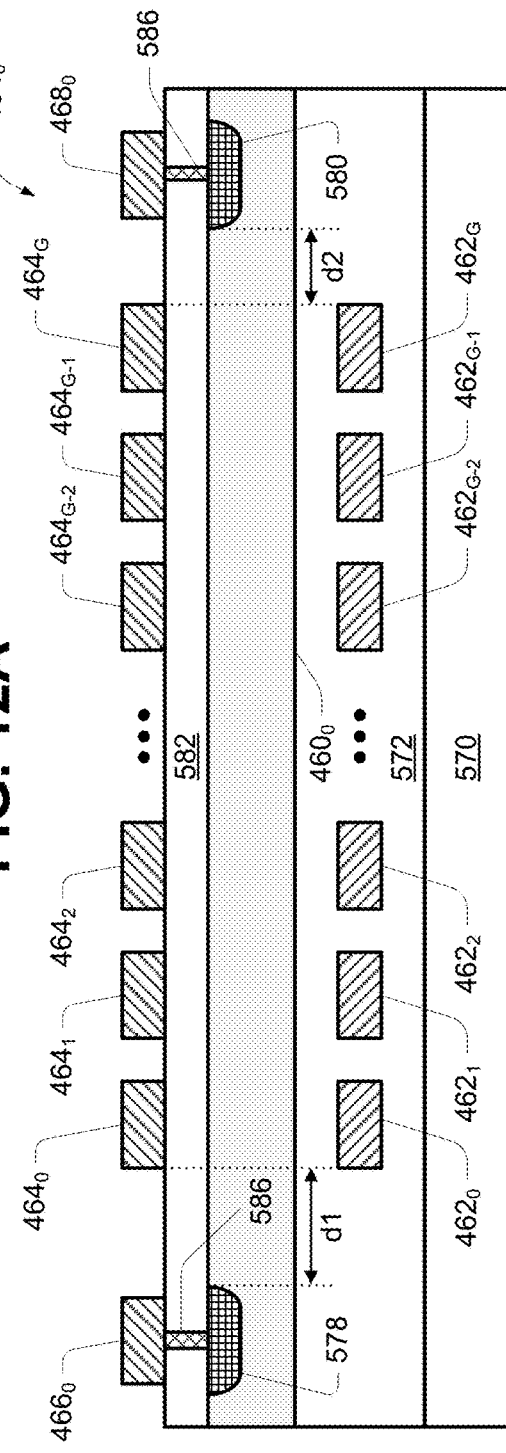

As depicted in FIG. 12B, the distance (e.g., lateral distance) d1 between the first source/drain region 578 and a nearest control gate, e.g., a control gate having lower control gate portion $462_0$ and upper control gate portion $464_0$, might be different than the distance (e.g., lateral distance) d2 between the second source/drain region 580 and a nearest control gate, e.g., a control gate having lower control gate portion $462_G$ and upper control gate portion $464_G$. In particular, it might be desired to have different lengths of active area between the source side and the drain side of the transistor $454_0$ and a nearest control gate for each, e.g., due to an expected voltage drop across the transistor $454_0$. For example, the distance d1 might be larger than the distance d2 in view of an expectation that the voltage level of the voltage node be higher than the voltage level of the load node.

The embodiment of FIGS. 12A-12D might connect an upper control gate portion 464 and its corresponding lower control gate portion 462 to a same signal line of the block select line 356. Alternatively, a signal line of the block select line 356 might be connected to a particular control gate portion of a control gate, e.g., an upper control gate portion 464 or a lower control gate portion 462, and each remaining control gate portion of the control gate might be connected to that signal line only through their connection to the particular control gate portion.

Although the embodiment depicted with reference to FIGS. 5A-12D depicts three conductive vias 463 extending from a lower control gate portion 462 to an upper control gate portion 464 on two sides of an active area 460, alternate embodiments might utilize more or fewer conductive vias 463 to connect a lower control gate portion 462 to a corresponding upper control gate portion 464. The conductive vias 463 might be in contact with a majority of the length of each lower control gate portion 462 and upper control gate portion 464, as measured in a left-to-right direction on FIG. 12A. Furthermore, although the embodiment depicted with reference to FIGS. 5A-12D depicts multiple conductive vias 463 extending from a lower control gate portion 462 to an upper control gate portion 464 on two sides of an active area 460, alternate embodiments might utilize a single conductive via 463' on each side of the active area to connect a lower control gate portion 462 to a corresponding upper control gate portion 464. FIG. 13 is a cross-sectional view of a transistor of FIG. 4 in accordance with a further embodiment taken along line A-A of FIG. 4, where the conductive via 463' extends across a majority of the lengths of the lower control gate portion 462 and upper control gate portion 464, as measured in a left-to-right direction on FIG. 13. For some embodiments, the conductive via 463' might extend a full length of the lower control gate portion 462 or upper control gate portion 464, and further embodiments might extend beyond the full length of the lower control gate portion 462 or upper control gate portion 464. Although the cross-section of FIG. 13 depicts one side of the transistor $454_0$, this cross-section might equally apply to the other side of the transistor $454_0$, or to either side of the transistor $454_1$.

Figure 12C:
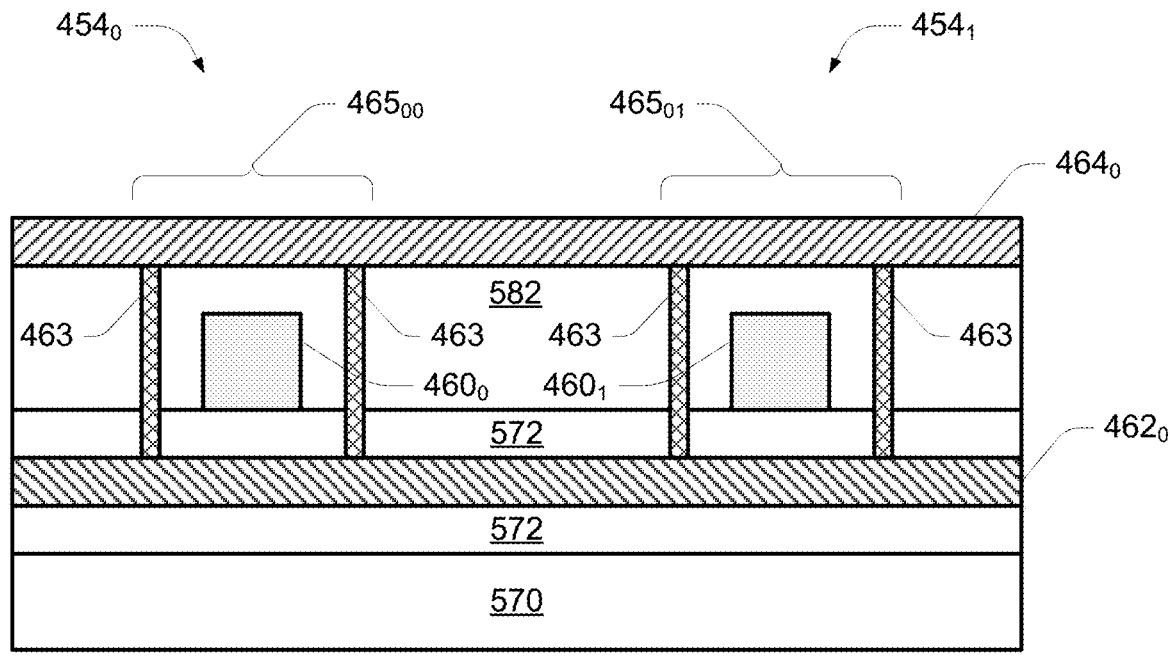
Figure 12D:
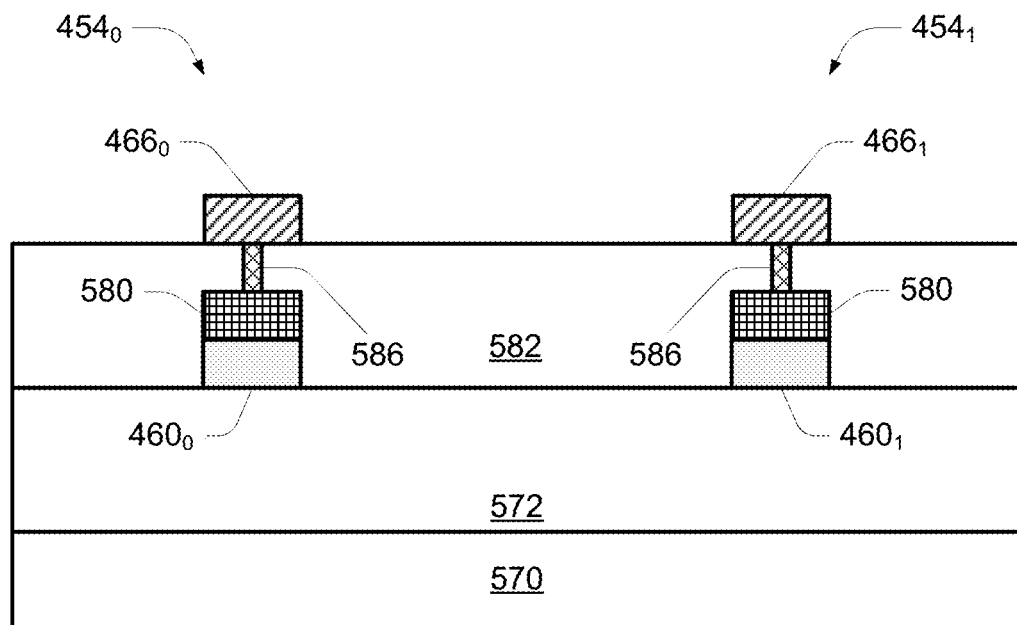
Figure 13:
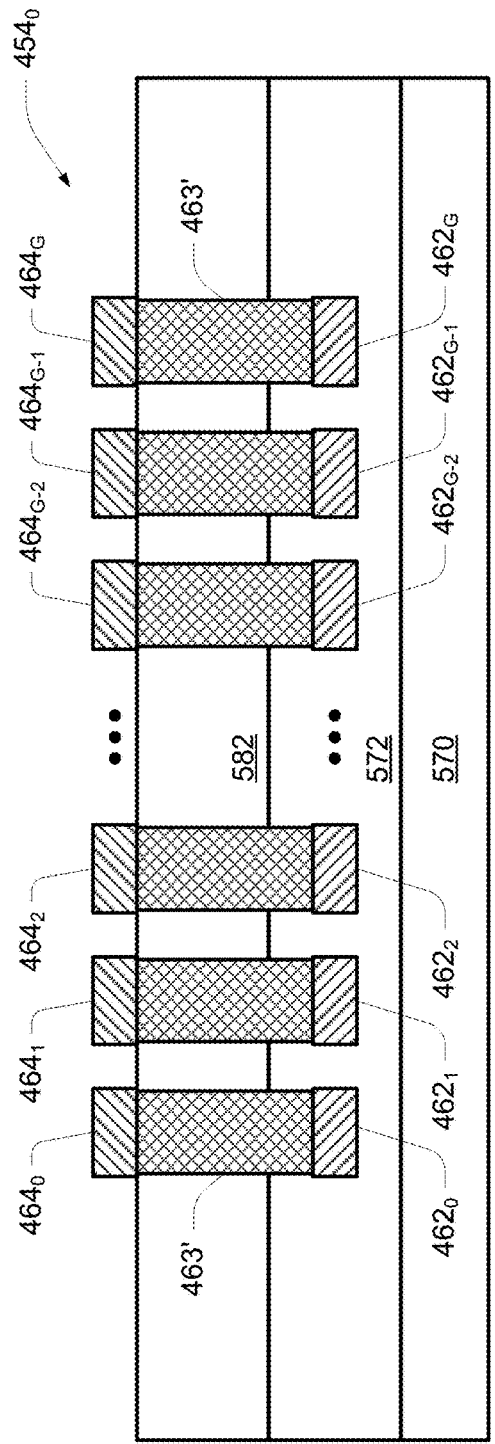
FIG. 13 is a cross-sectional view of a transistor of FIG. 4 in accordance with another embodiment.
Figure 14:
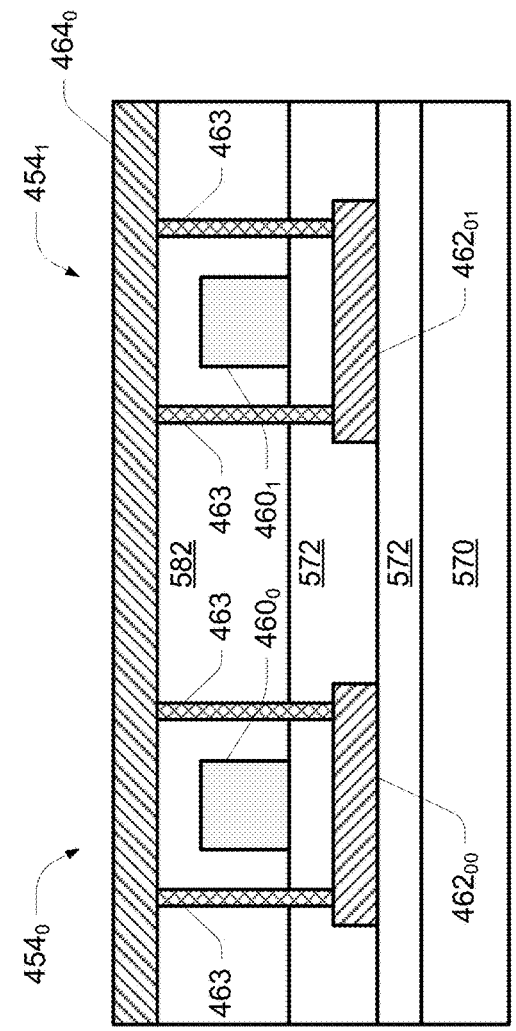
FIG. 14 is a cross-sectional view of the transistors of FIG. 4 in accordance with a further embodiment.

In addition, although the embodiment depicted with reference to FIGS. 5A-12D depicts the lower control gate portions 462 extending between adjacent transistors, e.g., between transistors $454_0$ and $454_1$ as depicted in FIG. 12C, alternate embodiments might separate lower control gate portions 462 of adjacent transistors. FIG. 14 is a cross-sectional view of transistors of FIG. 4 in accordance with a further embodiment taken along line C-C of FIG. 4. FIG. 14 depicts an example where the transistor $454_0$ has a lower control gate portion $462_{00}$ separated from a lower control gate portion $462_{01}$ of transistor $454_1$. Such separated lower control gate portions 462 might be defined during the patterning of the conductor 574 as discussed with reference to FIGS. 6A-6D. Although the cross-section of FIG. 14 depicts the lower control gate portions $462_{00}$ and $462_{01}$, this cross-section might equally apply to any of the lower control gate portions 462 as they might all have a similar, e.g., the same, structure.

Furthermore, although the embodiment depicted with reference to FIGS. 5A-12D depicts the active areas 460 surrounded by control gate portions 462, 463 and 464, e.g., having control gate portions adjacent surfaces of an active area 460 in four planes, various embodiments may only partially surround the active areas 460, e.g., having control gate portions adjacent surfaces of an active areas 460 in fewer than four planes. FIGS. 15A-15E are cross-sectional views of transistors of FIG. 4 in accordance with various embodiments having control gate portions adjacent surfaces of the active areas 460 in fewer than four planes. Directional terms in the description of FIGS. 15A-15E will be from the point of view of a viewer of the figures.

Figure 15A:
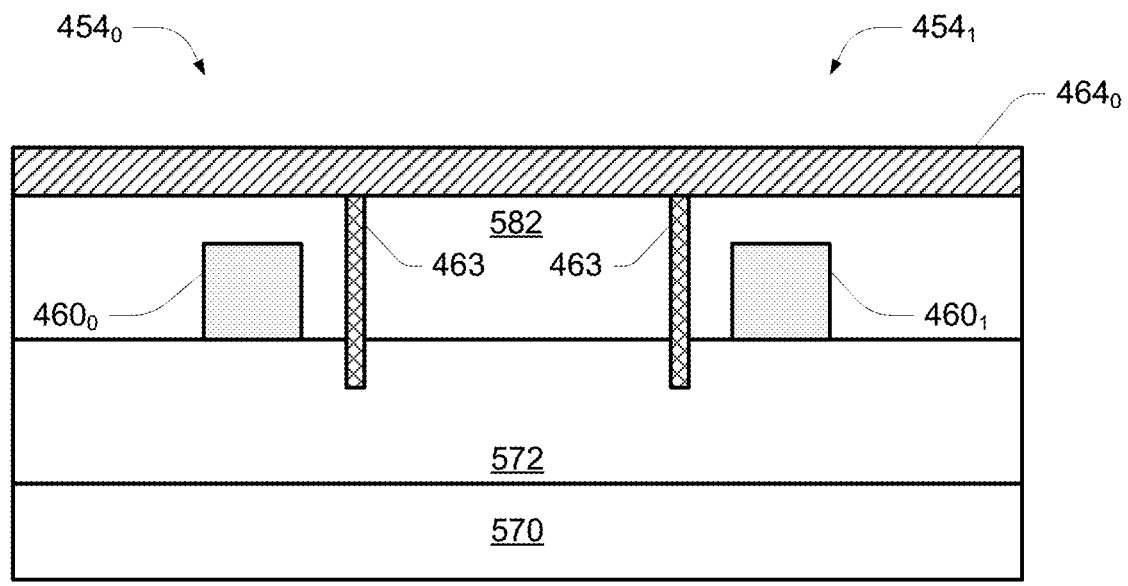
FIGS. 15A-15E are cross-sectional views of transistors of FIG. 4 in accordance with various embodiments.

In FIG. 15A, the transistors 454 have control gate portions adjacent surfaces, e.g., a top surface and a side surface, of each of the active areas 460 in two planes. For example, for each active area 460, the upper control gate portion $464_0$ is adjacent an upper surface of the active areas 460 extending in a plane, e.g., a horizontal plane, above the active areas 460; and the respective side control gate portions 463 are adjacent side surfaces of the active areas 460 extending in planes, e.g., vertical planes, adjacent side surfaces of the active areas 460, e.g., a right side surface of active area $460_0$ and a left side surface of active area $460_1$. Note that such embodiments having side control gate portions 463 on one side of an active area 460 might alternatively be on a same side of each active area 460. For example, the side control gate portions 463 might be adjacent a right side of each active area $460_0$ and $460_1$, or adjacent a left side of each active area $460_0$ and $460_1$. In addition, embodiments might stagger on which side a side control gate portion 463 is placed for different control gates. For example, the side control gate portion 463 might be adjacent the right side surface of the active area $460_0$ for the upper control gate portion $464_0$ as depicted in FIG. 15A, and a side control gate portion 463 might be adjacent the left side surface of the active area $460_0$ for the upper control gate portion $464_1$.

Figure 15B:
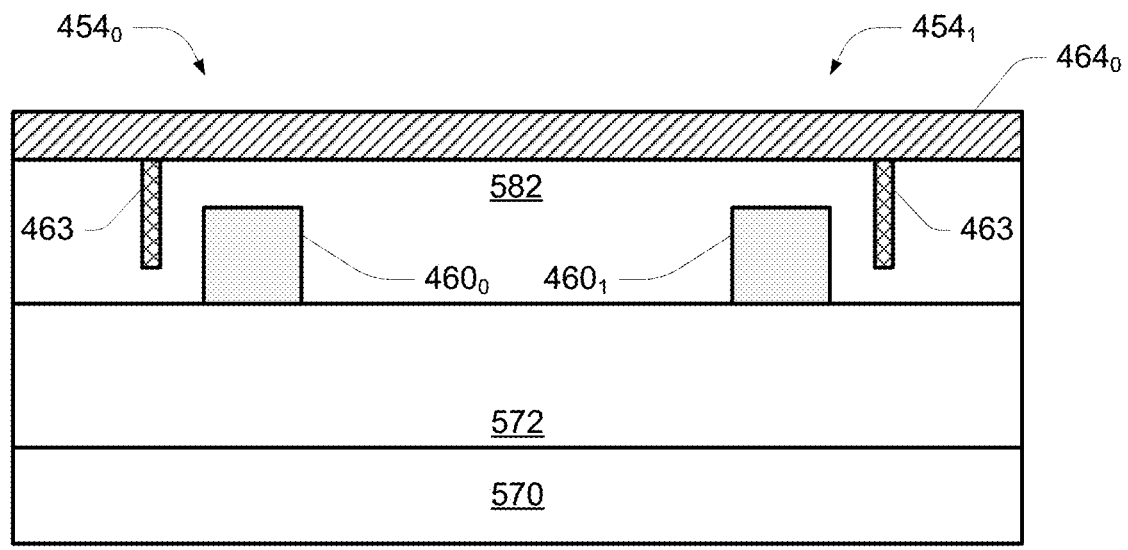

In FIG. 15B, the transistors 454 have control gate portions adjacent surfaces, e.g., a top surface and a side surface, of each of the active areas 460 in two planes similar to that discussed with reference to FIG. 15A. However, while the side control gate portions 463 of FIG. 15A are depicted to extend beyond an entirety of the thickness of the active areas 460, e.g., as measured from the top surface to the bottom surface of the active areas 460, the side control gate portions 463 in FIG. 15B are depicted to extend along less than the entirety of the thickness of the active areas 460.

Figure 15C:
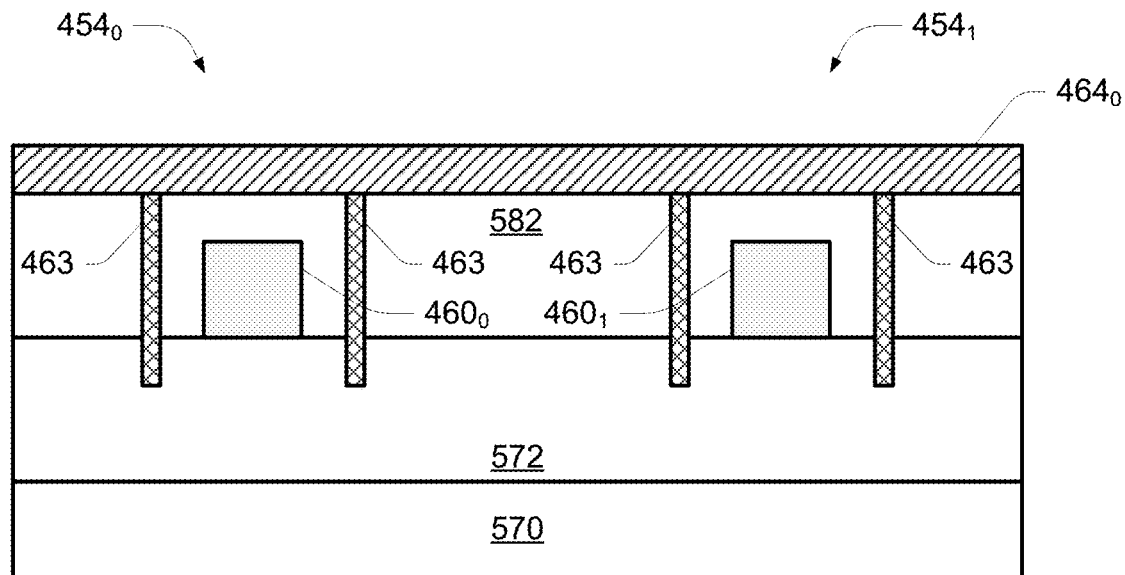

In FIG. 15C, the transistors 454 have control gate portions adjacent surfaces of each of the active areas 460 in three planes, e.g., a top surface and both side surfaces. Similar to the discussion of FIG. 15A, the side control gate portions 463 might extend the entirety of the thickness of the active areas 460, which might include extending beyond the bottom surface of the active areas 460 as depicted, or they might extend less than the entirety of the thickness of the active areas 460 as discussed with reference to FIG. 15B.

Figure 15D:
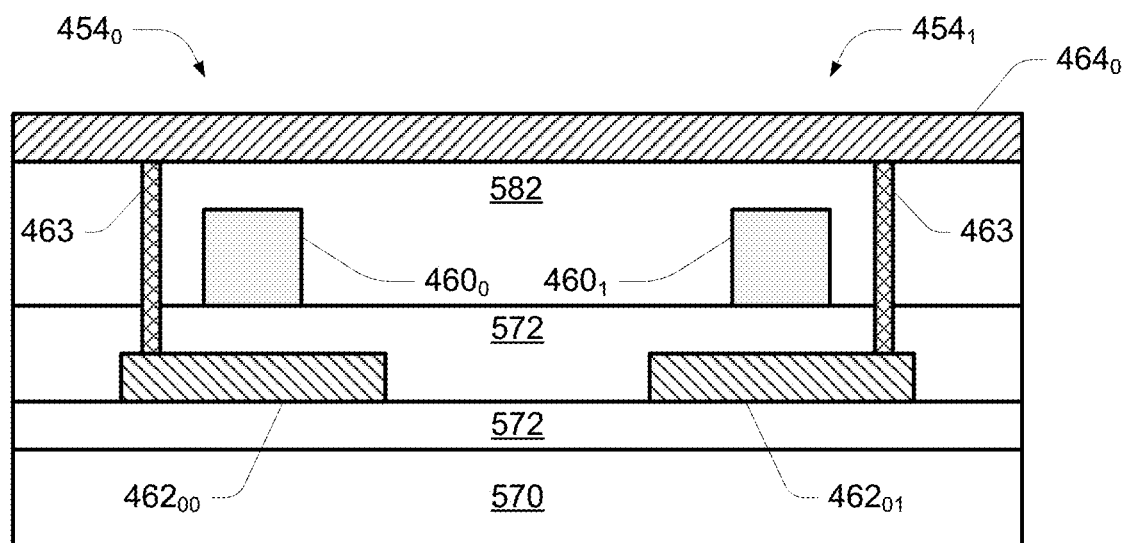

In FIG. 15D, the transistors 454 have control gate portions adjacent surfaces of each of the active areas 460 in three planes, e.g., a top surface, one side surface and a bottom surface. For example, for each active area 460, the upper control gate portion $464_0$ is adjacent an upper surface of the active areas 460 extending in a plane, e.g., a horizontal plane, above the active areas 460; the respective side control gate portions 463 are adjacent side surfaces of the active areas 460 extending in planes, e.g., vertical planes, adjacent side surfaces of the active areas 460, e.g., a left side surface of active area $460_0$ and a right side surface of active area $460_1$; and the lower control gate portions $462_{00}$ and $462_{01}$ are adjacent a lower surface of the active areas 460 extending in a plane, e.g., a horizontal plane, below the active areas 460. Although the embodiment of FIG. 15D depicts lower control gate portions 462 of different active areas 460 separated from one another, the lower control gate portions could utilize a single conductor such as depicted in FIG. 12C. Although not necessary, such an embodiment using a single conductor for the lower control gate portions 462 might connect both the lower control gate portion 462 and the upper control gate portion 464 to a same signal line of the block select line 356. Alternatively, such an embodiment might connect the signal line of the block select line 356 to only one of the upper control gate portion 464 and the lower control gate portion 462.

Figure 15E:
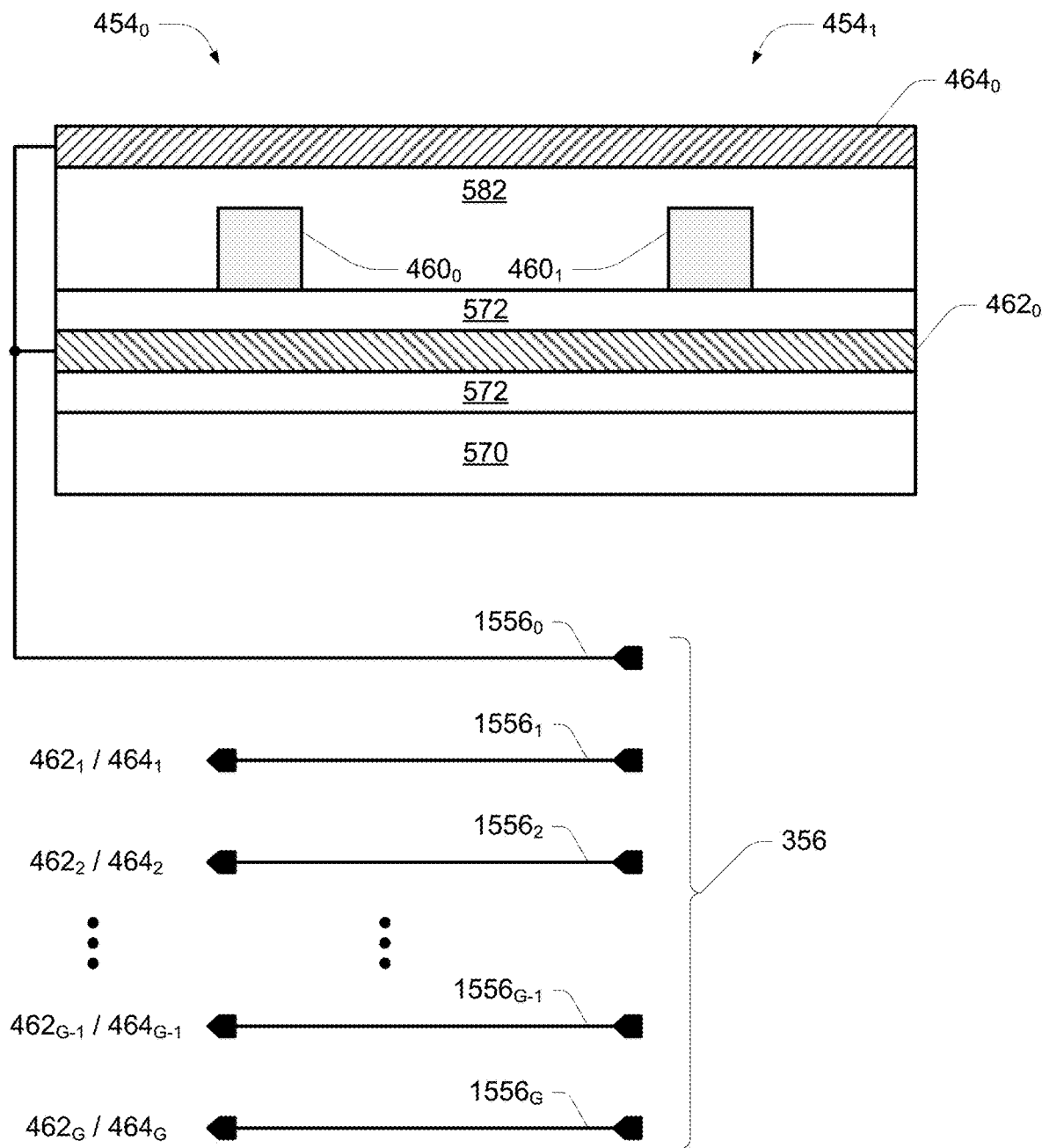

In FIG. 15E, the transistors 454 have control gate portions adjacent surfaces of each of the active areas 460 in two planes, e.g., a top surface and a bottom surface. The embodiment of FIG. 15E utilizes a single conductor for the lower control gate portions 462. For example, for each active area 460, the upper control gate portion $464_0$ is adjacent an upper surface of the active areas 460 extending in a plane, e.g., a horizontal plane, above the active areas 460; and the lower control gate portion $462_0$ is adjacent a lower surface of the active areas 460 extending in a plane, e.g., a horizontal plane, below the active areas 460. The upper control gate portion $464_0$ and the lower control gate portion $462_0$ might be commonly connected to a signal line $1556_0$ of a block select line 356. Each remaining signal line $1556_1$-$1556_G$ of the block select line 356 might be similarly commonly connected to respective pairs of upper control gate portions 464 and lower control gate portions 462 as indicated.

Figure 16:
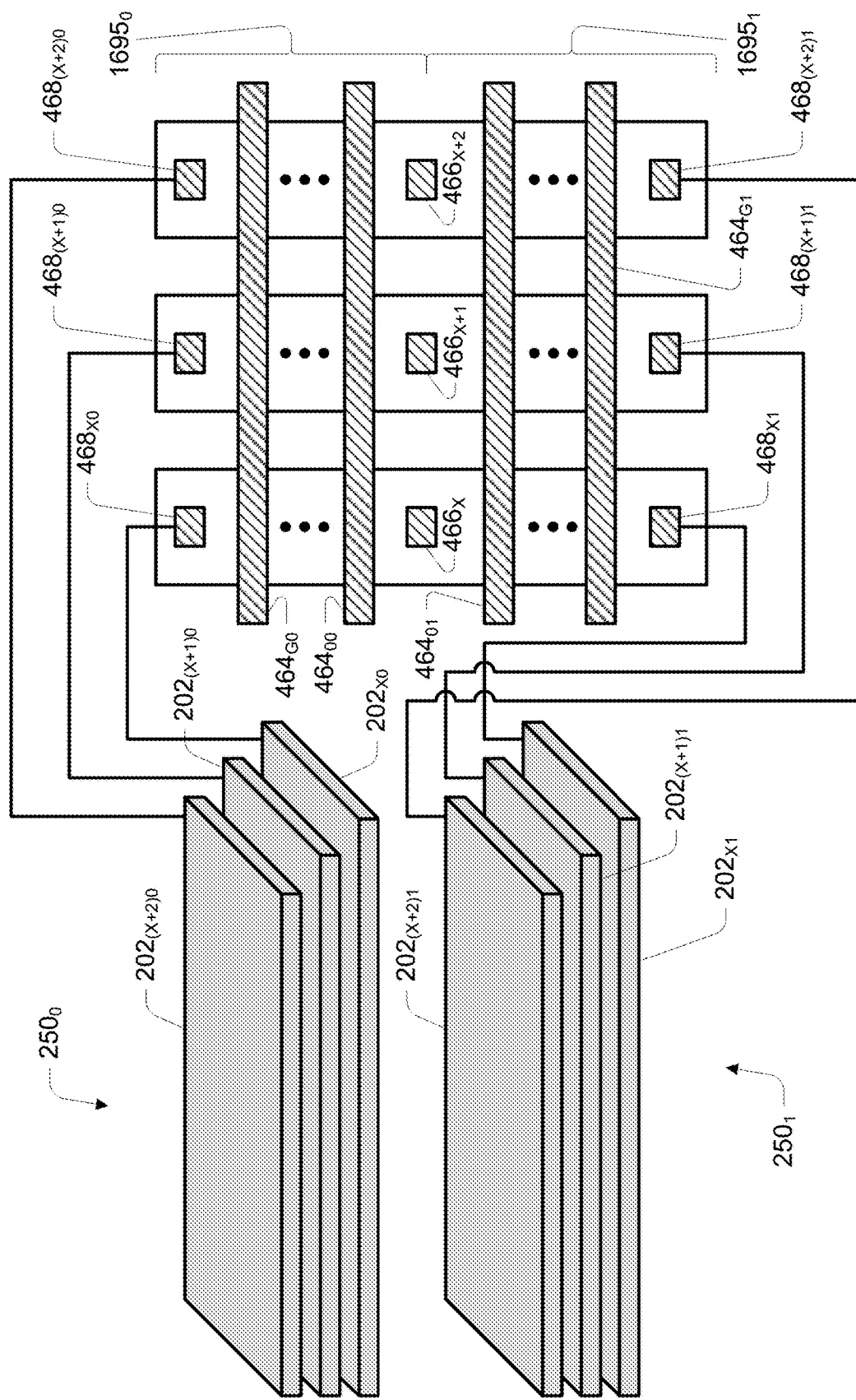
FIG. 16 conceptually depicts connection of a portion of a string driver connected to access lines of multiple blocks of memory cells in accordance with an embodiment.

FIG. 16 conceptually depicts connection of a portion of a string driver circuitry connected to access lines of multiple blocks of memory cells in accordance with an embodiment. For example, a first string driver $1695_0$ might have transistors (not enumerated in FIG. 16) corresponding to conductors $464_{00}$-$464_{G0}$ and connected between first contacts 466, e.g., first contacts $466_X$, $466_{X+1}$, and $466_{X+2}$, and corresponding second contacts 468, e.g., second contacts $468_{X0}$, $468_{(X+1)0}$, and $468_{(X+2)0}$, respectively, and a second string driver $1695_1$ might have transistors (not enumerated in FIG. 16) corresponding to conductors $464_{01}$-$464_{G1}$ and connected between first contacts 466, e.g., first contacts $466_X$, $466_{X+1}$, and $466_{X+2}$, and corresponding second contacts 468, e.g., second contacts $468_{X1}$, $468_{(X+1)1}$, and $468_{(X+2)1}$, respectively. The transistors of the string drivers $1695_0$ and $1695_1$ might correspond to the transistors 454 depicted in FIGS. 4 and 12A-12D, for example.

The second contacts $468_{X0}$, $468_{(X+1)0}$, and $468_{(X+2)0}$ of the first string driver $1695_0$ might be connected to word lines $202_{X0}$, $202_{(X+1)0}$, and $202_{(X+2)0}$, respectively, of a block of memory cells $250_0$. The word lines $202_{X0}$, $202_{(X+1)0}$, and $202_{(X+2)0}$ might represent only a portion of word lines of the block of memory cells $250_0$. For example, the block of memory cells $250_0$ might include N+1 word lines 202 such as depicted in FIG. 2A, and the word lines $202_{X0}$, $202_{(X+1)0}$, and $202_{(X+2)0}$ of the block of memory cells $250_0$ might correspond to word lines $202_X$, $202_{X+1}$, and $202_{X+2}$, respectively, of FIG. 2A.

The second contacts $468_{X1}$, $468_{(X+1)1}$, and $468_{(X+2)1}$ of the second string driver $1695_1$ might be connected to word lines $202_{X1}$, $202_{(X+1)1}$, and $202_{(X+2)1}$, respectively, of a block of memory cells $250_1$. The word lines $202_{X1}$, $202_{(X+1)1}$, and $202_{(X+2)1}$ might represent only a portion of the word lines of the block of memory cells $250_1$. For example, the block of memory cells $250_1$ might include N+1 word lines 202 such as depicted in FIG. 2A, and the word lines $202_{X1}$, $202_{(X+1)1}$, and $202_{(X+2)1}$ of the block of memory cells $250_1$ might correspond to word lines $202_X$, $202_{X+1}$, and $202_{X+2}$, respectively, of FIG. 2A.

The string drivers $1695_0$ and $1695_1$ might be a portion of the peripheral circuitry 226 of FIG. 2C. For example, the string driver $1695_0$ might be formed under (e.g., at least partially under) the word lines $202_{X0}$, $202_{(X+1)0}$, and $202_{(X+2)0}$ of the block of memory cells $250_0$. Similarly, the string driver $1695_1$ might be formed under (e.g., at least partially under) the word lines $202_{X1}$, $202_{(X+1)1}$, and $202_{(X+2)1}$ of the block of memory cells $250_1$. Alternatively, the string driver $1695_0$ might be formed over (e.g., at least partially over) the word lines $202_{X0}$, $202_{(X+1)0}$, and $202_{(X+2)0}$ of the block of memory cells $250_0$, and the string driver $1695_1$ might be formed over (e.g., at least partially over) the word lines $202_{X1}$, $202_{(X+1)1}$, and $202_{(X+2)1}$ of the block of memory cells $250_1$.

To activate a string driver 1695, or any of its corresponding transistors, e.g., transistor $454_0$ of FIG. 4, a reference potential, e.g., ground, 0V or Vss, might be applied to each of the conductors $464_0$-$464_G$ as the transistor might be a normally-on transistor, whether the active area 460 has a p-type or n-type conductivity.

To deactivate a string driver 1695, or any of its corresponding transistors, e.g., transistor $454_0$ of FIG. 4, one or more positive voltage levels (e.g., for a p-type active area) or one or more negative voltage level (e.g., for an n-type active area) having sufficient magnitude might be applied to one or more of the conductors $464_0$-$464_G$. For some embodiments, the voltage level applied to the conductor $464_0$ has a magnitude that is greater than or equal to the respective magnitudes of the voltage levels applied to the remaining conductors $464_1$-$464_G$. For further embodiments, the voltage level applied to the conductor $464_Q$ has a magnitude that is greater than or equal to the respective magnitudes of the voltage levels applied to the remaining conductors $464_{Q+1}$-$464_G$. for each value of Q satisfying the relationship $0<=Q<=G-1$. For still further embodiments, a voltage difference between the voltage level applied to conductor $464_Q$ and the voltage level applied to conductor $464_{Q+1}$ is less than or equal to a voltage difference between the voltage level applied to conductor $464_{Q+1}$ and the voltage level applied to conductor $464_{Q+2}$ for each value of Q satisfying the relationship $0<=Q<=G-2$.

As one example of deactivating a transistor of the type depicted in FIG. 4 where G=8, where the first contact 466 is configured to receive 30V, and where the second contact 468 is at 0V, the conductor $464_0$ might be configured to receive 30V, the conductor $464_1$ might be configured to receive 30V, the conductor $464_2$ might be configured to receive 28V, the conductor $464_3$ might be configured to receive 25V, the conductor $464_4$ might be configured to receive 20V, the conductor $464_5$ might be configured to receive 15V, the conductor $464_6$ might be configured to receive 10V, the conductor $464_7$ might be configured to receive 5V, and the conductor $464_8$ might be configured to receive 0V.

Figure 17:
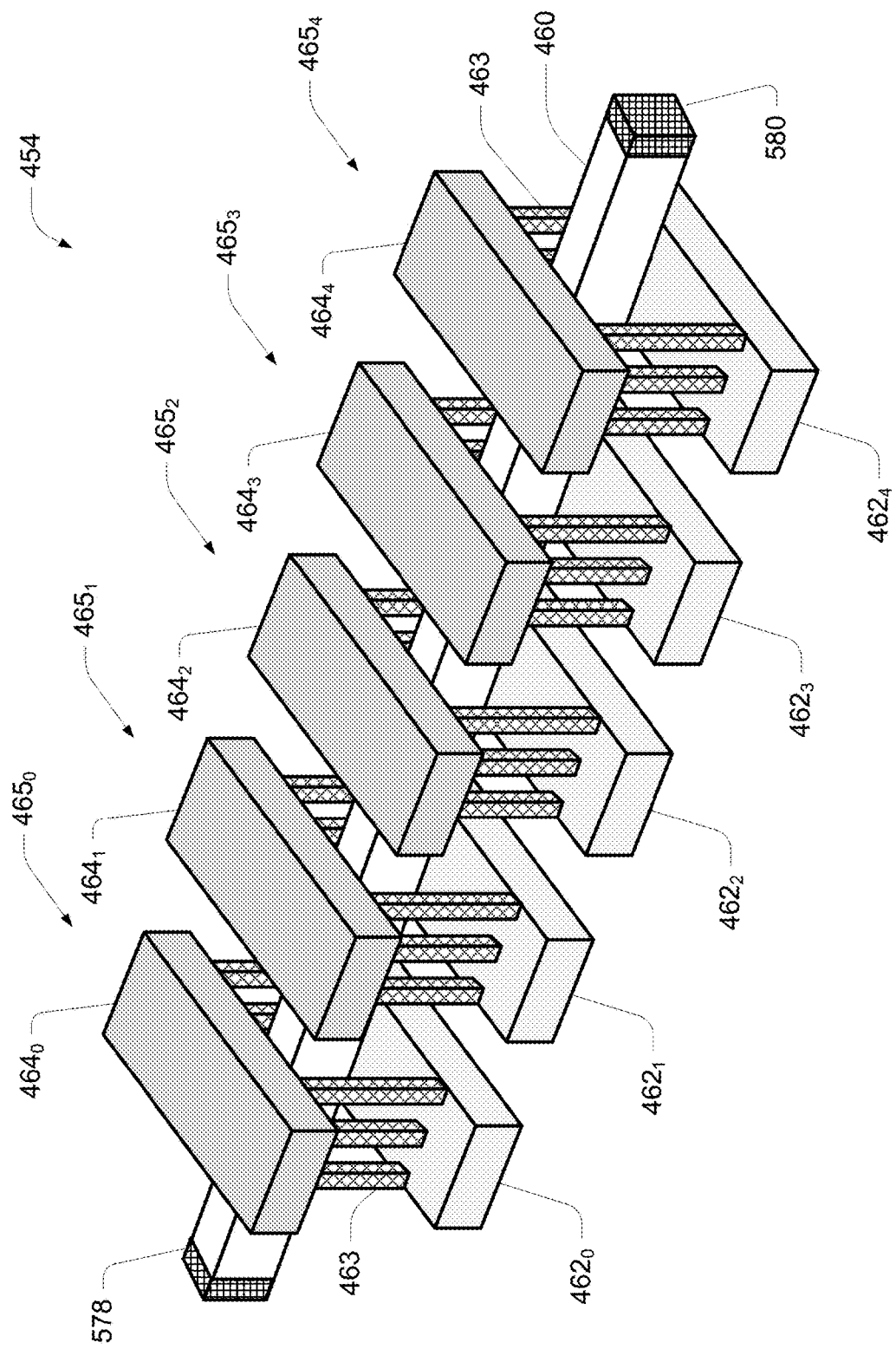
FIG. 17 is a perspective view of a transistor in accordance with an embodiment.

FIG. 17 is a perspective view of a transistor 454 in accordance with an embodiment. Like numbered elements in FIG. 17 correspond to the description as provided with respect to FIGS. 5A-12D. In the embodiment of FIG. 17, the variable G is equal to four, such that the transistor 454 of FIG. 17 includes five control gates $465_0$-$465_4$. FIG. 17 further depicts an embodiment where the first source/drain region 578 and the second source/drain region 580 extend a full thickness of the active area 460.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A multi-gate transistor, comprising:
an active area having a first conductivity type;
a first source/drain region in the active area and having a second conductivity type different than the first conductivity type;
a second source/drain region in the active area and having the second conductivity type; and
a plurality of control gates adjacent the active area between the first source/drain region and the second source/drain region;
wherein each control gate of the plurality of control gates comprises a respective plurality of control gate portions; and
wherein, for a particular control gate of the plurality of control gates, each control gate portion of its respective plurality of control gate portions is adjacent the active area in a respective plane of a plurality of different planes.

2. The multi-gate transistor of claim 1, wherein each control gate of the plurality of control gates is independent of each remaining control gate of the plurality of control gates.

3. The multi-gate transistor of claim 1, wherein the respective plurality of control gate portions of the particular control gate comprises a conductive first control gate portion in a first plane of the plurality of different planes and a conductive second control gate portion is a second plane of the plurality of different planes.

4. The multi-gate transistor of claim 3, wherein the conductive second control gate portion comprises a different conductive material than the conductive first control gate portion.

5. The multi-gate transistor of claim 3, wherein the second plane is in an orientation selected from a group consisting of orthogonal to the first plane and parallel to the first plane.

6. The multi-gate transistor of claim 3, wherein the respective plurality of control gate portions of the particular control gate further comprises a conductive third control gate portion in a third plane of the plurality of different planes.

7. The multi-gate transistor of claim 6, wherein the second plane is orthogonal to the first plane, and wherein the third plane is parallel to the first plane.

8. The multi-gate transistor of claim 6, wherein the respective plurality of control gate portions of the particular control gate further comprises a conductive fourth control gate portion in a fourth plane of the plurality of different planes that is orthogonal to the first plane and parallel to the second plane.

9. The multi-gate transistor of claim 1, wherein the first conductivity type is a p-type conductivity and the second conductivity type is an n-type conductivity.

10. The multi-gate transistor of claim 1, wherein the first source/drain region and the second source/drain region have a dopant concentration greater than a dopant concentration of the active area.

11. The multi-gate transistor of claim 10, wherein the active area has a dopant concentration of undoped to 2 E18/cm$^3$.

12. The multi-gate transistor of claim 11, wherein the first source/drain region and the second source/drain region each have a dopant concentration of 2 E18-1 E21/cm$^3$.

13. A memory, comprising:
an array of memory cells;
a plurality of access lines with each access line of the plurality of access lines commonly connected to control gates of a respective plurality of memory cells of the array of memory cells; and
driver circuitry comprising a plurality of transistors with each transistor of the plurality of transistors connected to a respective access line of the plurality of access lines;
wherein a particular transistor of the plurality of transistors comprises:
an active area having a first conductivity type;
a first source/drain region in the active area and having a second conductivity type different than the first conductivity type;
a second source/drain region in the active area and having the second conductivity type; and
a plurality of control gates adjacent the active area between the first source/drain region and the second source/drain region;
wherein each control gate of the plurality of control gates comprises a respective plurality of control gate portions;
wherein, for a particular control gate of the plurality of control gates, each control gate portion of its respective plurality of control gate portions is adjacent the active area in a respective plane of a plurality of different planes; and
wherein the second source/drain region of the particular transistor is connected to the respective access line for the particular transistor.

14. The memory of claim 13, wherein a lateral distance between the first source/drain region and a control gate of the plurality of control gates nearest the first source/drain region is greater than a lateral distance between the second source/drain region and a control gate of the plurality of control gates nearest the second source/drain region.

15. The memory of claim 13, wherein, for a different control gate of the plurality of control gates, each control gate portion of its respective plurality of control gate portions is adjacent the active area in a respective plane of the plurality of different planes.

16. The memory of claim 15, wherein each control gate portion of the respective plurality of control gate portions for the different control gate is in a same plane of the plurality of different planes as a corresponding control gate portion of the respective plurality of control gate portions for the particular control gate.

17. The memory of claim 13, wherein a different transistor of the plurality of transistors comprises:
a third source/drain region in the active area and having the second conductivity type; and
a second plurality of control gates surrounding the active area between the first source/drain region and the third source/drain region;
wherein the third source/drain region of the different transistor is connected to the respective access line for the different transistor.

18. The memory of claim 13, wherein the active area is a first active area, wherein the plurality of control gates is a first plurality of control gates, wherein the plurality of different planes is a first plurality of different planes, and wherein a different transistor of the plurality of transistors comprises:
  a second active area having the first conductivity type;
  a third source/drain region in the second active area and having the second conductivity type;
  a fourth source/drain region in the second active area and having the second conductivity type; and
  a second plurality of control gates adjacent the second active area between the third source/drain region and the fourth source/drain region;
  wherein each control gate of the second plurality of control gates comprises a respective plurality of control gate portions; and
  wherein, for a particular control gate of the second plurality of control gates, each control gate portion of its respective plurality of control gate portions is adjacent the active area in a respective plane of a second plurality of different planes;
  wherein the fourth source/drain region of the different transistor is connected to the respective access line for the different transistor; and
  wherein each control gate of the first plurality of control gates is connected to a respective control gate of the second plurality of control gates.

19. The memory of claim 18, wherein the particular control gate of the first plurality of control gates is connected to its respective control gate of the second plurality of control gates using two conductors formed on opposing sides of the first active area.

20. The memory of claim 18, wherein the particular control gate of the first plurality of control gates is connected to its respective control gate of the second plurality of control gates through only a single conductor.

21. The memory of claim 13, wherein the particular control gate of the plurality of control gates comprises a conductive lower control gate portion, two conductive side control gate portions, and a conductive upper control gate portion.

22. The memory of claim 21, wherein the conductive lower control gate portion comprises a first metal, wherein the conductive side control gate portions comprise a conductively-doped polysilicon, and wherein the conductive upper control gate portion comprises a second metal.

23. The memory of claim 22, wherein the first metal and the second metal are a same metal.

24. The memory of claim 21, wherein each conductive side control gate portion comprises a plurality of conductive vias in contact with the conductive lower control gate portion and in contact with the conductive upper control gate portion.

25. The memory of claim 21, wherein each conductive side control gate portion comprises a single conductive via in contact with the conductive lower control gate portion and in contact with the conductive upper control gate portion.

26. The memory of claim 25, wherein the single conductive via for one of the conductive side control gate portions is in contact with a majority of a length of the conductive lower control gate portion and in contact with a majority of a length of the conductive upper control gate portion.

27. The memory of claim 26, wherein the single via for one of the conductive side control gate portions is in contact with an entire length of the conductive lower control gate portion and in contact with an entire length of the conductive upper control gate portion.

28. A method of forming a multi-gate transistor, comprising:
  forming a semiconductor material having a first conductivity type overlying a first dielectric material;
  patterning the semiconductor material to form an active area;
  forming a first source/drain region having a second conductivity type, different than the first conductivity type, in the active area, and forming a second source/drain region having the second conductivity type in the active area;
  forming a second dielectric material overlying the active area and overlying the first dielectric material;
  forming a first conductive via in the second dielectric material in contact with the first source/drain region;
  forming a second conductive via in the second dielectric material in contact with the second source/drain region;
  forming a plurality of third conductive vias in the second dielectric material;
  forming a conductive material overlying the first conductive via, overlying the second conductive via, overlying the plurality of third conductive vias, and overlying the second dielectric material, wherein the conductive material is in contact with the first conductive via, in contact with the second conductive via, and in contact with the plurality of third conductive vias; and
  patterning the second conductive material to form a plurality of upper control gate portions, a first contact to the first source/drain region, and a second contact to the second source/drain region.

29. The method of claim 28, wherein forming the semiconductor material having the first conductivity type comprises forming a p-type polysilicon.

30. The method of claim 29, wherein forming the first source/drain region having the second conductivity type in the active area, and forming the second source/drain region having the second conductivity type in the active area, comprises conductively doping the p-type polysilicon using an n-type dopant species.

31. The method of claim 28, wherein, prior to forming the semiconductor material, the method further comprises:
  forming a second conductive material overlying a third dielectric material;
  patterning the first conductive material to form a plurality of lower control gate portions; and
  forming the first dielectric material overlying the plurality of lower control gate portions and overlying the third dielectric material;
  wherein each lower control gate portion of the plurality of lower control gate portions is formed to be laterally between the subsequently-formed first source/drain region and the subsequently-formed second source/drain region;
  wherein each third conductive via of the plurality of third conductive vias is subsequently formed to be in contact with a respective lower control gate portion of the plurality of lower control gate portions; and
  wherein each third conductive via of the plurality of third conductive vias is subsequently formed such that each lower control gate portion of the plurality of lower control gate portions would be in contact with at least one of the third conductive vias of the plurality of third conductive vias.

32. A method of forming a multi-gate transistor, comprising:
  forming a first conductive material overlying a first dielectric material;

patterning the first conductive material to form a plurality of lower control gate portions;

forming a second dielectric material overlying the plurality of lower control gate portions and overlying the first dielectric material;

forming a semiconductor material having a first conductivity type overlying the second dielectric material;

patterning the semiconductor material to form an active area overlying the plurality of lower control gate portions;

forming a first source/drain region having a second conductivity type, different than the first conductivity type, in the active area, and forming a second source/drain region having the second conductivity type in the active area, wherein each lower control gate portion of the plurality of lower control gate portions is laterally between the first source/drain region and the second source/drain region;

forming a third dielectric material overlying the active area and overlying the second dielectric material;

forming a first conductive via in the third dielectric material in contact with the first source/drain region;

forming a second conductive via in the third dielectric material in contact with the second source/drain region;

forming a second conductive material overlying the first conductive via, overlying the second conductive via, and overlying the third dielectric material, wherein the second conductive material is in contact with the first conductive via and in contact with the second conductive via; and patterning the second conductive material to form a plurality of upper control gate portions, a first contact to the first source/drain region, and a second contact to the second source/drain region.

* * * * *